United States Patent
Miyashita et al.

(10) Patent No.: US 7,913,221 B2
(45) Date of Patent: Mar. 22, 2011

(54) INTERCONNECT STRUCTURE OF SEMICONDUCTOR INTEGRATED CIRCUIT, AND DESIGN METHOD AND DEVICE THEREFOR

(75) Inventors: Hirofumi Miyashita, Osaka (JP); Chie Kabuo, Kyoto (JP); Nobuyuki Iwauchi, Kyoto (JP); Yoichi Matsumura, Kyoto (JP); Fumihiro Kimura, Kyoto (JP); Tatsuo Gou, Kyoto (JP); Yukiji Hashimoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 593 days.

(21) Appl. No.: 11/907,999

(22) Filed: Oct. 19, 2007

(65) Prior Publication Data
US 2008/0097641 A1    Apr. 24, 2008

(30) Foreign Application Priority Data

Oct. 20, 2006 (JP) .................... 2006-286239

(51) Int. Cl.
*G06F 17/50* (2006.01)
(52) U.S. Cl. .............. 716/139; 716/126; 716/129
(58) Field of Classification Search .......... 716/1, 11, 716/13, 100, 118, 126, 129, 139; 700/121; 438/800
See application file for complete search history.

(56) References Cited

U.S. PATENT DOCUMENTS

| | | | | |
|---|---|---|---|---|
| 5,095,352 | A * | 3/1992 | Noda et al. | 257/202 |
| 5,258,329 | A * | 11/1993 | Shibata | 438/620 |
| 5,391,921 | A | 2/1995 | Kudoh et al. | |
| 5,798,937 | A * | 8/1998 | Bracha et al. | 716/9 |
| 6,211,561 | B1 * | 4/2001 | Zhao | 257/522 |
| 6,798,029 | B2 * | 9/2004 | Volant et al. | 257/415 |
| 6,917,109 | B2 * | 7/2005 | Lur et al. | 257/758 |
| 7,073,142 | B2 * | 7/2006 | Kodama et al. | 716/4 |
| 2003/0049945 | A1 | 3/2003 | Hyoto et al. | |
| 2003/0064577 | A1* | 4/2003 | Hsu et al. | 438/619 |
| 2004/0101996 | A1 | 5/2004 | Hyoto et al. | |
| 2004/0121577 | A1* | 6/2004 | Yu et al. | 438/622 |
| 2005/0110130 | A1* | 5/2005 | Kitabayashi et al. | 257/698 |

FOREIGN PATENT DOCUMENTS

| | | |
|---|---|---|
| JP | 63-098134 | 4/1988 |
| JP | 2087547 | 3/1990 |
| JP | 2003-078015 | 3/2003 |
| JP | 2006-120988 | 5/2006 |

* cited by examiner

*Primary Examiner* — Sun J Lin
(74) *Attorney, Agent, or Firm* — McDermott Will & Emery LLP

(57) ABSTRACT

A method for designing an interconnect structure of an interconnect layer in a semiconductor integrated circuit device includes the steps of: (a) inputting layout data of the semiconductor integrated circuit device; (b) controlling an air gap exclusion area based interconnects in the layout data; and (c) outputting layout data including the air gap exclusion area determined in the step (b).

20 Claims, 27 Drawing Sheets

```
         :
# X_AirGap_NoSpacing = minValue , maxValue
Metal1_AirGap_NoSpacing = 04um , 0.5um
Metal2_AirGap_NoSpacing = 04um , 0.5um
         :
         :
```

INTERCONNECT STRUCTURE OF SEMICONDUCTOR INTEGRATED CIRCUIT, AND DESIGN METHOD AND DEVICE THEREFOR

CROSS-REFERENCE TO RELATED APPLICATIONS

This application claims priority under 35 U.S.C. §119 on Patent Application No. 2006-286239 filed in Japan on Oct. 20, 2006, the entire contents of which are hereby incorporated by reference.

BACKGROUND OF THE INVENTION

The present invention relates to an interconnect structure of a semiconductor integrated circuit having air gaps in submicron processes, and a design method and device for the same.

In recent years, with achievement of finer semiconductor processes, the integration of semiconductor integrated circuits has become significantly higher. Higher integration however extremely narrows the spacing between interconnects, causing a problem of increase in parasitic capacitance between interconnects. The increase in parasitic capacitance between interconnects will result in occurrence of a crosstalk phenomenon in which an electric signal leaks between interconnects, increase of a RC delay of interconnects and increase of power consumption.

In view of the above, in the field of semiconductor fabrication technologies, studies are being made vigorously on an interlayer insulating film low in dielectric constant (low-k film) that reduces the parasitic capacitance between interconnects, with an eye toward the under 45 nm process. Besides the studies on the low-k film, an interconnect structure has been proposed in which voids (hereinafter, called air gaps) are intentionally formed of the air in an insulating film between interconnects (see Japanese Patent Gazette No. 2087547 [Patent Literature 1], for example). Such air gaps using the air whose dielectric constant is 1 are argued to give a further low relative dielectric constant than the low-k film.

As a fabrication method in which air gaps are generated, a conventional technology is known in which after insertion of a metal layer in an insulating film, air gap generation positions are etched using a resist pattern masking air gap exclusion areas. It is proposed to designate a region around a via as an air gap exclusion area to prevent an air gap from communicating with the via due to an alignment deviation that may occur during semiconductor fabrication (see Japanese Laid-Open Patent Publication No. 2006-120988 [Patent Literature 2], for example).

Air gaps are voids generated because the material of an insulating film to be deposited on a metal layer has failed to flow into the positions of the voids. The open width of such voids has an upper limit for allowing generation of air gaps depending on the material of the insulating film. For this reason, as a design method for an interconnect structure of a semiconductor integrated circuit, proposed has been a technology of reducing the interconnect spacing by adding a dummy pattern to thereby increase the number of air gaps (see Japanese Patent Gazette No. 3481222 [Patent Literature 3], for example).

However, the conventional ways of generating air gaps have the following problems.

First, no consideration has been given to a detriment that may result from imprudent reduction of the parasitic capacitance between interconnects. In the under 180 nm process, hold timing errors occur frequently because of increase in the propagation time lag of a clock signal (clock skew) caused by crosstalk, IR drop, operation conditions and the like. Air gaps generated without consideration of a delay will further increase the hold timing error. Patent Literature 3, in which a dummy pattern is formed to ensure interconnect spacing of a given value or less so as to generate as many air gaps as possible, has this problem. Also, the reduction in capacitance between power supply traces will cause power supply noise.

Secondly, in design of a semiconductor integrated circuit, routing considering air gap-caused capacitance reduction has not been made. While the interconnect delay can be reduced with the air gap-caused capacitance reduction, a huge number of steps will be consumed for timing convergence.

Thirdly, in Patent Literature 2, in which a resist pattern for exclusion of generation of air gaps is generated, as the number of exclusion positions increases and thus the graphic data amount increases, the OPC processing time will increase. This also applies to the case of generating a pattern for designating positions for formation of air gaps.

Fourthly, no consideration has been given to a possibility that an air gap may pass through an overlying insulating film depending on the size of the air gap. Air gaps have a cone-shaped upper portion due to deposition of the insulating film. If the interconnect spacing in which an air gap is formed is so large that the cone-shaped portion of the air gap becomes high in level, the apex of the air gap may possibly be shaved off during grinding of the insulating film. An overlying film may flow into the resultant void causing reduction in yield.

Fifthly, in Patent Literature 2, a region around a via is designated as an air gap exclusion area to avoid an air gap from communicating with the via. With several millions to several tens of millions of vias formed on one chip, search for vias is complicate in formation of air gap exclusion areas, and this increases the processing time.

SUMMARY OF THE INVENTION

An object of the present invention is providing a design method and device for an interconnect structure, meant for generating minimum required air gaps considering the effect and detriment brought about by the air gap-caused reduction in parasitic capacitance between interconnects and the yield and for facilitating formation of air gap exclusion areas.

The present invention is directed to a method and device for designing an interconnect structure of an interconnect layer in a semiconductor integrated circuit device, which controls an air gap exclusion area in a short time for an interconnect that may cause a detriment such as occurrence of a timing error and reduction in yield at the time of generation of an air gap.

In the control of an air gap exclusion area, preferably, a timing error position is specified based on the timing calculation results, the amount and position of an air gap exclusion area is specified, and the air gap exclusion area is formed or deleted.

In the control of an air gap exclusion area, preferably, air gap exclusion areas are formed for all timing error positions.

In the control of an air gap exclusion area, preferably, the total interconnect length of each path is calculated, and an air gap exclusion area is formed for interconnects whose total length is equal to or less than a given threshold.

In the control of an air gap exclusion area, preferably, the length of an interconnect is calculated, and an air gap exclusion area is formed for an interconnect whose length is equal to or less than a given threshold.

In the control of an air gap exclusion area, preferably, an air gap exclusion area is formed in a region interposed between dummy traces.

The present invention is also directed to an interconnect structure of an interconnect layer having an air gap in a semiconductor integrated circuit device, wherein no air gap exists in a region interposed between dummy traces.

In the control of an air gap exclusion area, preferably, an air gap exclusion area is formed in a region interposed between power supply traces.

The present invention is also directed to an interconnect structure of an interconnect layer having an air gap in a semiconductor integrated circuit device, wherein no air gap exists in a region interposed between power supply traces.

In the control of an air gap exclusion area, preferably, an air gap exclusion area is formed over the entire chip, a timing error position is specified from the timing calculation results, a portion of the air gap exclusion area to be deleted is calculated, and the calculated portion is deleted.

In the control of an air gap exclusion area, preferably, a dummy metal trace is formed to run alongside a specific interconnect, and an air gap exclusion area is formed between the specific interconnect and the dummy trace.

A required air gap amount may be determined from a parasitic capacitance value required between the specific interconnect and the dummy trace, to increase/decrease the air gap exclusion area.

The present invention is also directed to an interconnect structure of an interconnect layer having an air gap in a semiconductor integrated circuit device, wherein an air gap exists in some portion of a region interposed between interconnects running alongside each other with a same interconnect spacing and does not exist in the other portion.

Alternatively, the present invention is directed to a method and device for designing an interconnect structure of an interconnect layer in a semiconductor integrated circuit device, which controls interconnects to suppress a detriment such as occurrence of a timing error and reduction in yield.

In the control of interconnects, preferably, formation of interconnects within a specified range is prohibited using a physical shape design constraint file.

The physical shape design constraint file may have a constraint value prohibiting formation of interconnects having a spacing therebetween within a specified range.

The present invention is also directed to an interconnect structure of an interconnect layer having an air gap in a semiconductor integrated circuit device, wherein there exist no interconnects having a spacing therebetween falling within a specified range.

An air gap exclusion layer may be used, in addition to a metal layer and a via layer, for definition of a via in a library.

In the control of interconnects, preferably, interconnect constraint information is inputted, air gap-considering timing calculation is performed, and interconnects are changed considering an air gap-caused capacitance variation.

In the change of interconnects considering an air gap-caused capacitance variation, preferably, an interconnect is made to run alongside an interconnect having a setup timing error.

In the change of interconnects considering an air gap-caused capacitance variation, preferably, an interconnect is formed inside a specified interconnect spacing.

In the change of interconnects considering an air gap-caused capacitance variation, preferably, no via is formed inside a specified interconnect spacing.

In the change of interconnects considering an air gap-caused capacitance variation, preferably, formed is an interconnect detouring to ensure that no interconnect runs alongside an interconnect having a hold error with a spacing therebetween falling within a specified range.

According to the interconnect structure and the design method of the present invention, interconnects in which a detriment due to air gap-caused reduction in parasitic capacitance between interconnects has been minimized can be produced in a short time during and after automatic routing processing.

Also, according to the interconnect structure and the design method of the present invention, interconnects in which air gap-caused reduction in yield has been suppressed can be produced in a short time.

BRIEF DESCRIPTION OF THE DRAWINGS

FIG. 20 is a view demonstrating a design method for an interconnect structure in Embodiment 9.

DESCRIPTION OF THE PREFERRED EMBODIMENTS

Figure 1:
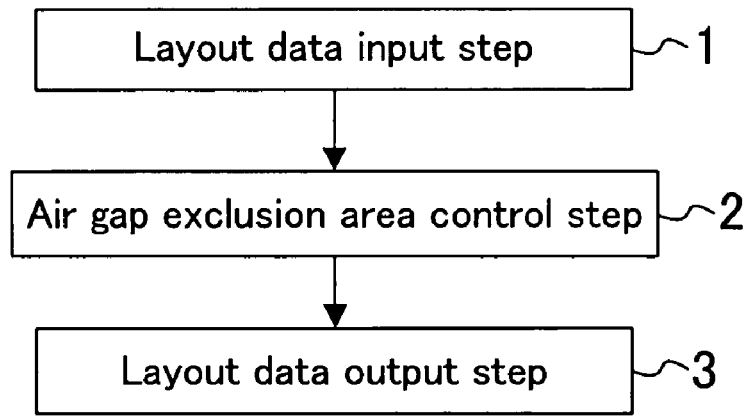
FIG. 1 is a flowchart of a design method for an interconnect structure covering Embodiments 1 to 8.

FIG. 1 is a flowchart showing a design method for an interconnect structure covering Embodiments 1 to 8. Layout data inputted in layout data input step 1 is subjected to control on air gap exclusion areas based on interconnects in air gap exclusion area control step 2. Layout data including determined air gap exclusion areas is outputted in layout data output step 3.

Figure 2:
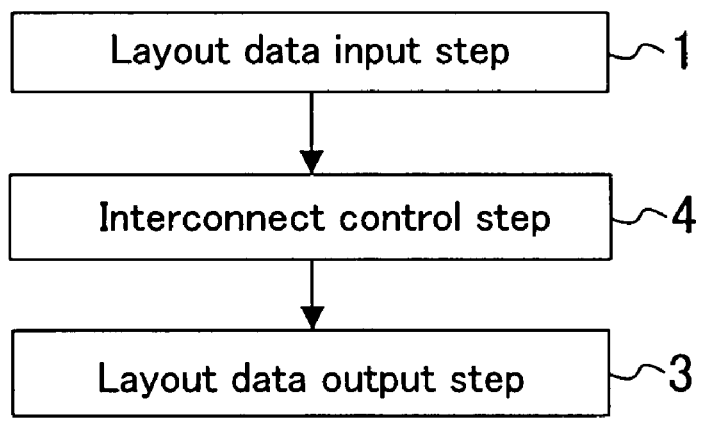
FIG. 2 is a flowchart of a design method for an interconnect structure covering Embodiments 9 to 11.

FIG. 2 is a flowchart showing a design method for an interconnect structure covering Embodiments 9 to 11. This design method is different from that of FIG. 1 in that interconnect control step 4 for controlling interconnects to control air gap generation positions is provided between the layout data input step 1 and the layout data output step 3.

Hereinafter, the individual embodiments will be described in detail with reference to the relevant drawings.

Embodiment 1

Figure 3:
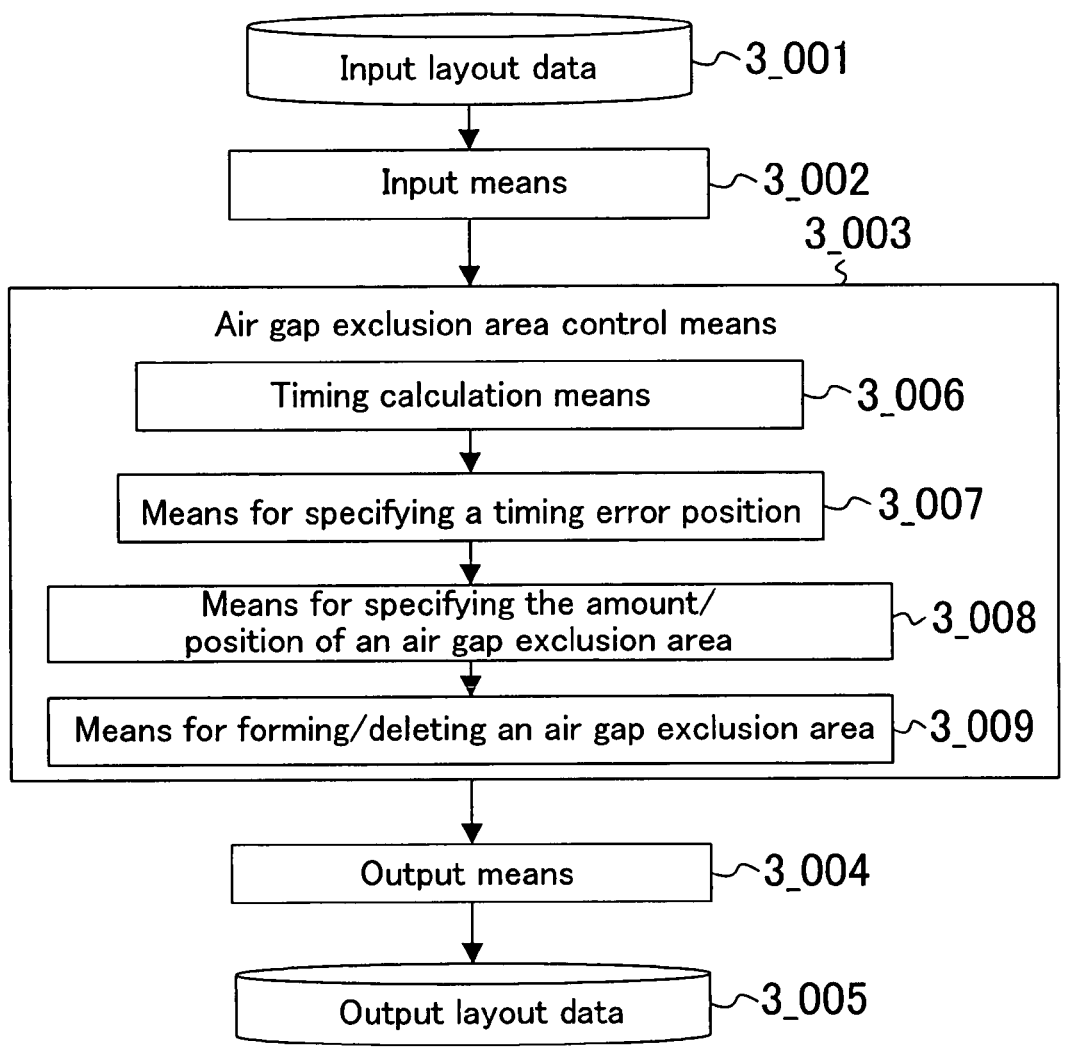
FIG. 3 is a block diagram of a design device for an interconnect structure in Embodiment 1.

FIG. 3 is a block diagram of a design device for an interconnect structure in Embodiment 1 of the present invention. Referring to FIG. 3, the design device for an interconnect structure includes: an input means 3_002 for receiving input layout data 3_001; an air gap exclusion area control means 3_003 for controlling air gap exclusion areas based on interconnects in the input layout data; and an output means 3_004 for outputting output layout data 3_005 including information on determined air gap exclusion areas. The air gap exclusion area control means 3_003 includes: a timing calculation means 3_006; a means 3_007 for specifying a timing error position; a means 3_008 for specifying the amount/position of an air gap exclusion area; and a means 3_009 for forming/deleting an air gap exclusion area.

The air gap exclusion area control means 3_003 forms/deletes an air gap exclusion area in the air gap exclusion area control step 2 in FIG. 1 described above.

Figure 4:
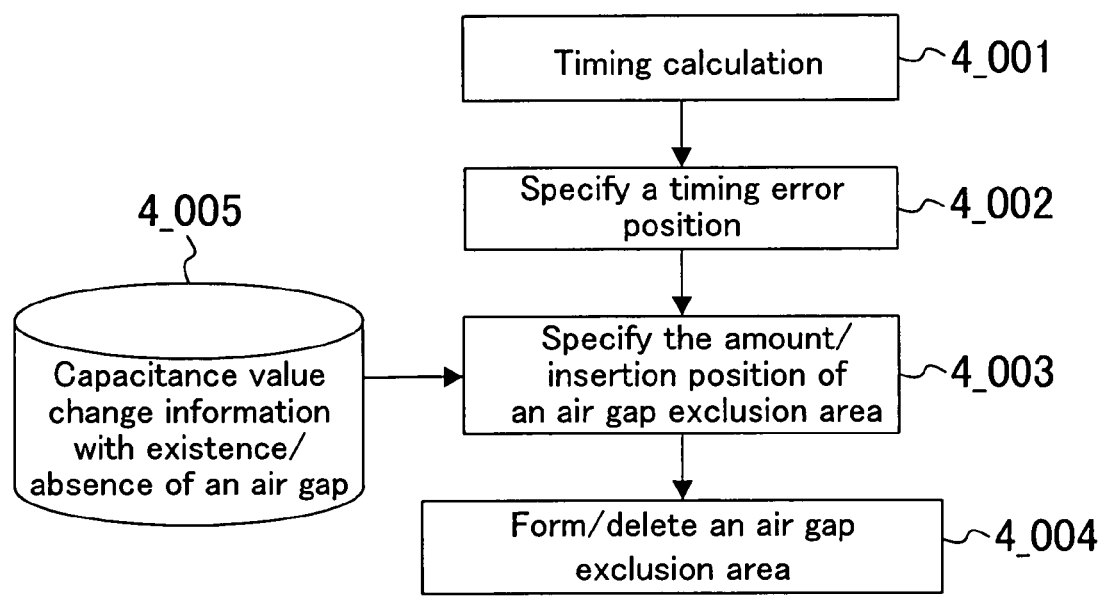
FIG. 4 is a flowchart of a design method for an interconnect structure in Embodiment 1.

FIG. 4 is a flowchart showing an operation of the air gap exclusion area control means 3_003 of the design device for an interconnect structure in this embodiment. Referring to FIG. 4, the operation of the design device for an interconnect structure in this embodiment will be described in association with the components of the air gap exclusion area control means 3_003 in FIG. 3.

In timing calculation step 4_001, the timing calculation means 3_006 performs timing calculation for the input layout data.

In step 4_002 of specifying a timing error position, the means 3_007 specifies a timing error position in the layout data based on the timing calculation results.

In step 4_003 of specifying the amount/insertion position of an air gap exclusion area, the means 3_008 determines the size of an air gap exclusion area based on the amount of change in interconnect parasitic capacitance obtained from information 4_005 on the capacitance value change with existence/absence of an air gap that has been defined separately. Also, the means 3_008 determines the insertion position of the air gap exclusion area from the status of interconnects around the timing error position.

In step 4_004 of forming/deleting an air gap exclusion area, the means 3_009 forms an air gap exclusion area at the air gap exclusion area insertion position determined in the step 4_003 for the input layout data.

Figure 5A:
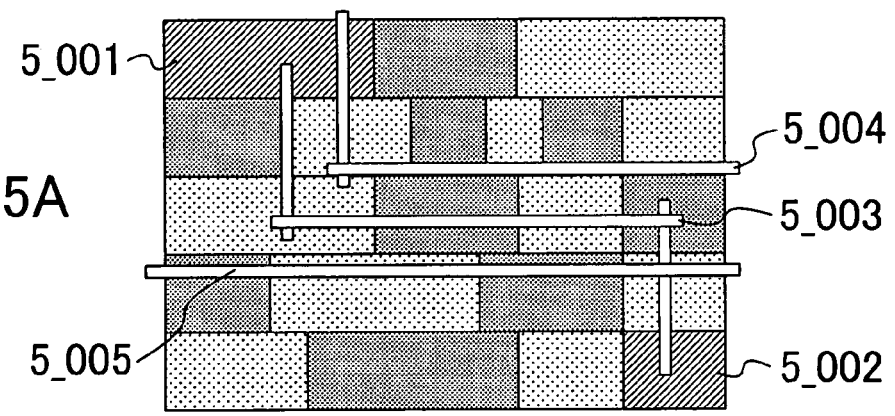
FIGS. 5A to 5C are views demonstrating the design method for an interconnect structure in Embodiment 1.
Figure 5B:
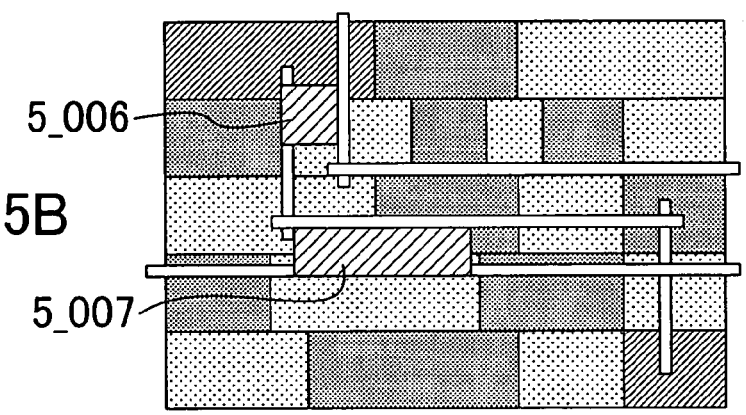
Figure 5C:
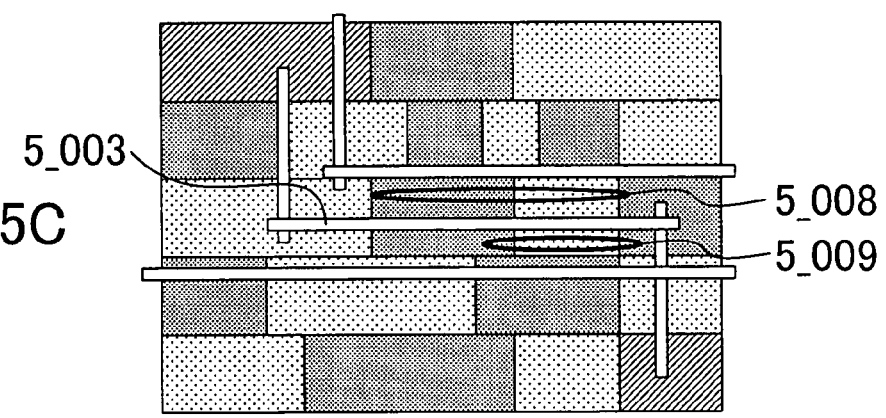

Referring to FIGS. 5A to 5C, the interconnect structure in this embodiment will be described.

FIG. 5A is a view showing an interconnect 5_003 connecting a cell 5_001 with a cell 5_002. Assume that the interconnect 5_003 has been specified as having a hold timing error in the step 4_002 of specifying a timing error position. In this case, the amount of an air gap exclusion area required to correct the hold timing error is calculated from the amount of the hold timing error of the interconnect 5_003 and the amount of change in interconnect parasitic capacitance with existence/absence of an air gap in the step 4_003 of specifying the amount/insertion position of an air gap exclusion area.

For example, assume that a hold timing error of 200 ps has occurred in the interconnect 5_003 and that as a result of calculation an air gap exclusion area having a width of 0.5 um and a total length of 2.5 um has been found necessary to correct this 200 ps hold timing error. In this case, the insertion position of an air gap exclusion area is determined to be in a region in which the interconnect 5_003 is adjacent to other interconnects 5_004 and 5_005 with a spacing of 0.5 um therebetween and have a total length of 2.5 um.

Such an air gap exclusion area may be formed at one position or a plurality of positions along the interconnect 5_003 so that the interconnects 5_004 and 5_005 may not have a setup timing error by inserting the air gap exclusion area.

FIG. 5B shows an example of formation of air gap exclusion areas at a plurality of positions. Air gap exclusion areas 5_006 and 5_007 are formed to prevent occurrence of a setup timing error in any adjacent interconnect.

FIG. 5C shows an interconnect structure including air gaps generated using the air gap exclusion areas 5_006 and 5_007. The resultant interconnect structure includes regions having the air gaps 5_008 and 5_009 and regions having no air gap in a mixed state around the interconnect 5_003.

Although the above example is meant for correcting a hold timing error by forming an air gap exclusion area, this embodiment also applies to correcting a setup timing error by forming an air gap generation area, correcting a setup timing error by deleting an air gap exclusion area, and correcting a hold timing error by deleting an air gap generation area.

As described above, with the step 4_002 of specifying a timing error position, the step 4_003 of specifying the amount/position of an air gap exclusion area based on the amount of change in capacitance value with existence/absence of an air gap, and the step 4_004 of forming/deleting an air gap exclusion area for layout data, a timing error can be corrected without changing interconnects in layout data. This can reduce the number of steps required to correct layout data for correction of a timing error.

Embodiment 2

A design method for an interconnect in Embodiment 2 of the present invention will be described.

In the design technique for an interconnect structure shown in Embodiment 1, the influence of the air gap amount on timing is calculated in the step 4_003 of specifying the amount/insertion position of an air gap exclusion area. This causes a problem of increasing the processing time.

In this embodiment, in the step 4_003, no calculation of the air gap exclusion area amount is made, but the following measures are taken for a timing error position. That is, an air gap exclusion area is uniformly formed for a hold error position while an air gap exclusion area is uniformly deleted for a setup error position.

Figure 6A:
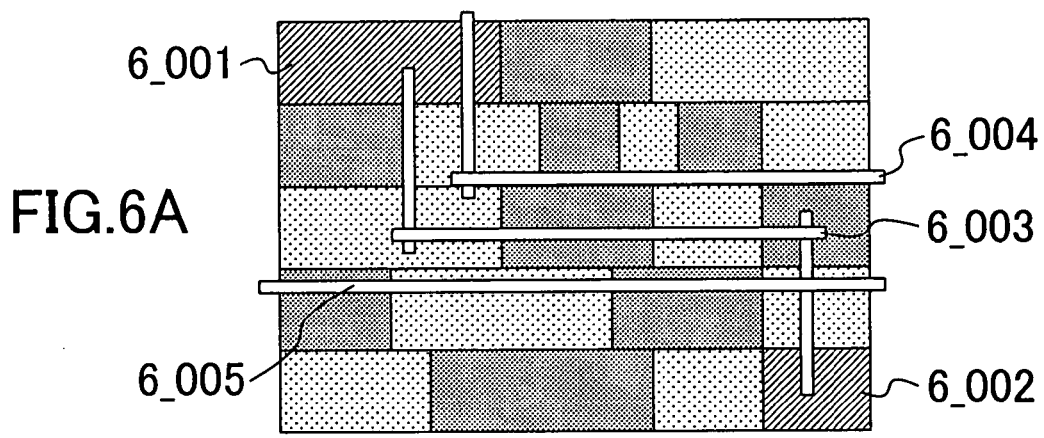
FIGS. 6A to 6C are views demonstrating a design method for an interconnect structure in Embodiment 2.
Figure 6B:
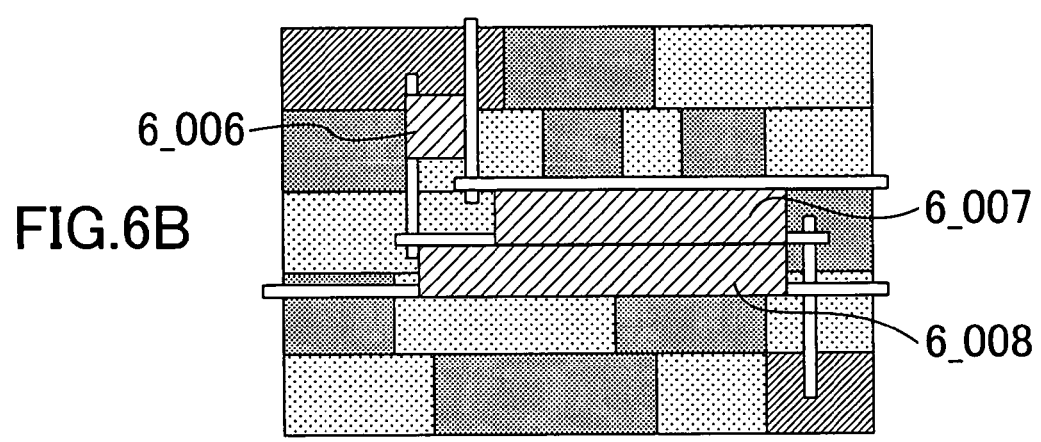
Figure 6C:
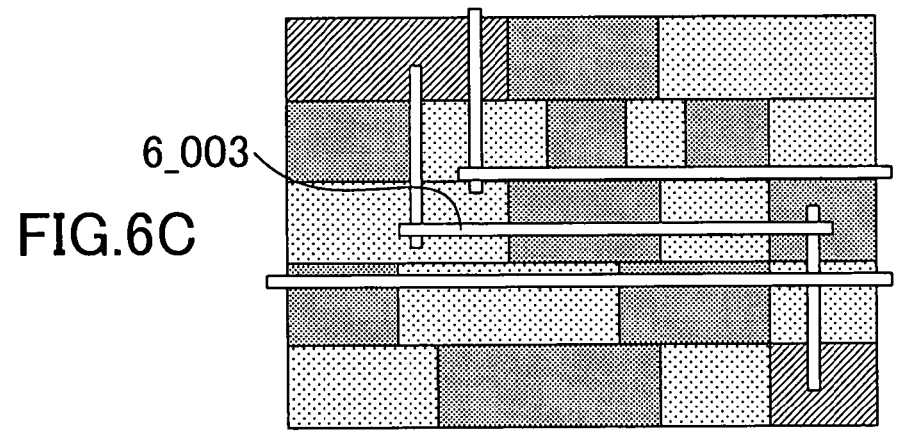

Referring to FIGS. 6A to 6C, an interconnect structure in this embodiment will be described.

FIG. 6A shows an interconnect 6_003 connecting a cell 6_001 with a cell 6_002. Assume that the interconnect 6_003 has been specified as having a hold timing error in the step 4_002 of specifying a timing error position. In this case, in the step 4_003 of specifying the amount/insertion position of an air gap exclusion area, the entire region along the route of the interconnect 6_003 is designated as the air gap exclusion area insertion position without calculating the air gap exclusion area insertion amount nor considering the timing status of interconnects 6_004 and 6_005.

FIG. 6B shows an example of formation of air gap exclusion areas. Air gap exclusion areas 6_006, 6_007 and 6_008 are uniformly formed along the route of the interconnect 6_003.

FIG. 6C shows an interconnect structure formed using the air gap exclusion areas 6_006, 6_007 and 6_008. No air gap is formed around the interconnect 6_003.

Note that in this embodiment, in which air gap exclusion areas are uniformly formed over the entire route of the interconnect having a hold error without calculating the air gap exclusion area insertion amount in the step 4_003 of specifying the amount/insertion position of an air gap exclusion area, there is a possibility that a setup error may occur in the interconnects 6_004 and 6_005 adjacent to the interconnect 6_003 having a hold error. In this case, such a setup timing error that may occur after the formation of the air gap exclusion areas can be reduced by specifying the insertion amount of the air gap exclusion areas in advance.

Although the above example is meant for correcting a hold timing error by forming an air gap exclusion area, this embodiment also applies to correcting a setup timing error by forming an air gap generation area, correcting a setup timing error by deleting an air gap exclusion area, and correcting a hold timing error by deleting an air gap generation area.

As described above, higher-speed control of air gap exclusion areas can be attained by taking the following measures for timing error positions, that is, forming an air gap exclusion area uniformly for a hold error position while deleting an air gap exclusion area uniformly for a setup error position, in the step 4_003 of specifying the amount/insertion position of an air gap exclusion area.

Embodiment 3

A design method for an interconnect structure in Embodiment 3 of the present invention will be described.

In the design methods for an interconnect structure shown in Embodiments 1 and 2, timing is calculated, and after specifying a timing error position, an air gap exclusion area is formed to avoid a timing error. For timing calculation, it is necessary to perform complicate delay calculation, and this disadvantageously requires a huge amount of calculation time.

This embodiment is characterized in forming air gap exclusion areas based on the total interconnect length of a path without calculating timing.

Figure 7:
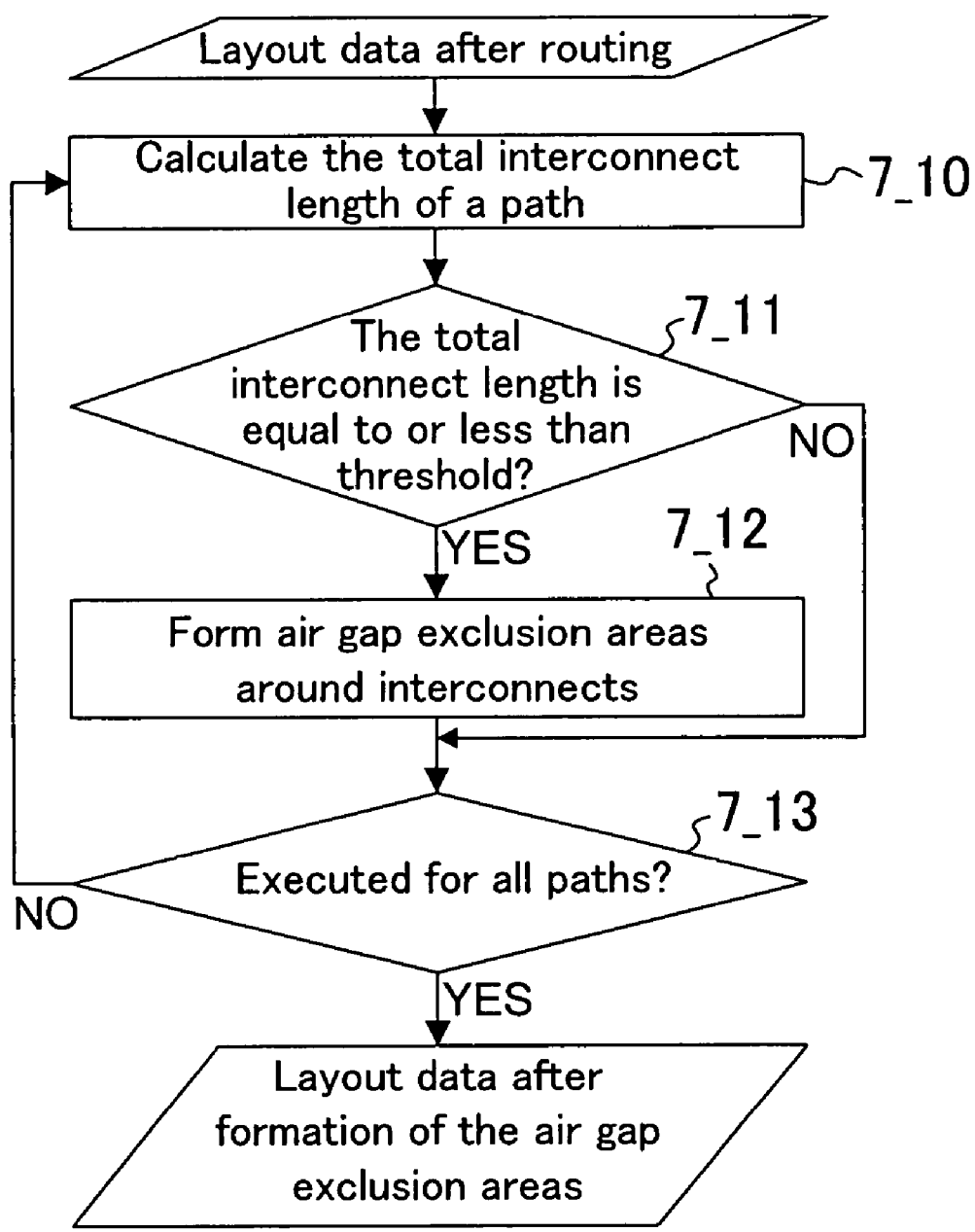
FIG. 7 is a flowchart of a design method for an interconnect structure in Embodiment 3.

FIG. 7 is a flowchart showing the design method for an interconnect structure in this embodiment related to the air gap exclusion area control step 2 in FIG. 1 described above.

Figure 8A:
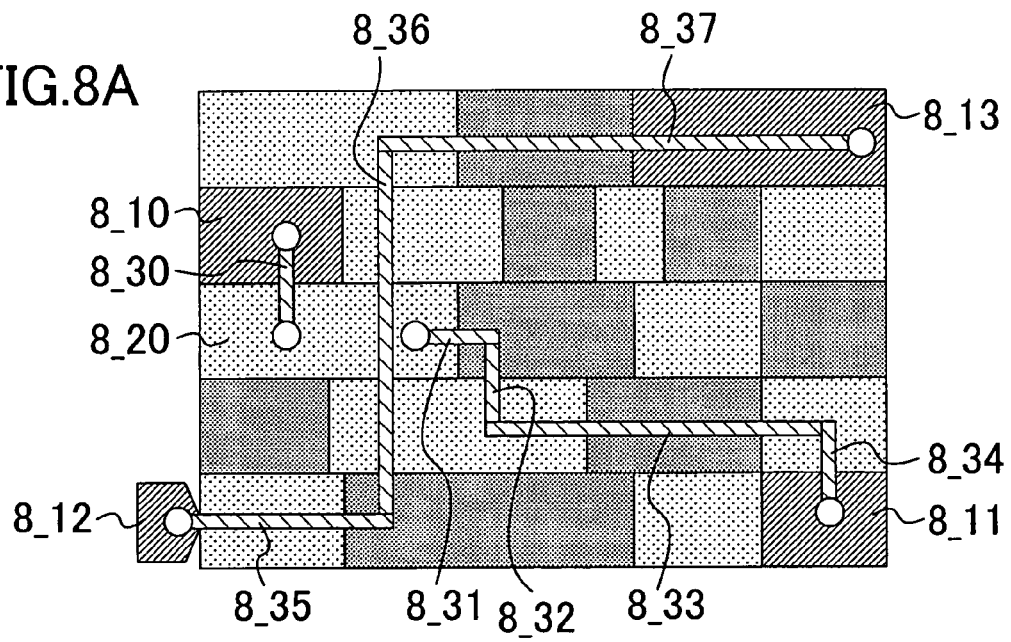
FIGS. 8A and 8B are views demonstrating the design method for an interconnect structure in Embodiment 3.
Figure 8B:
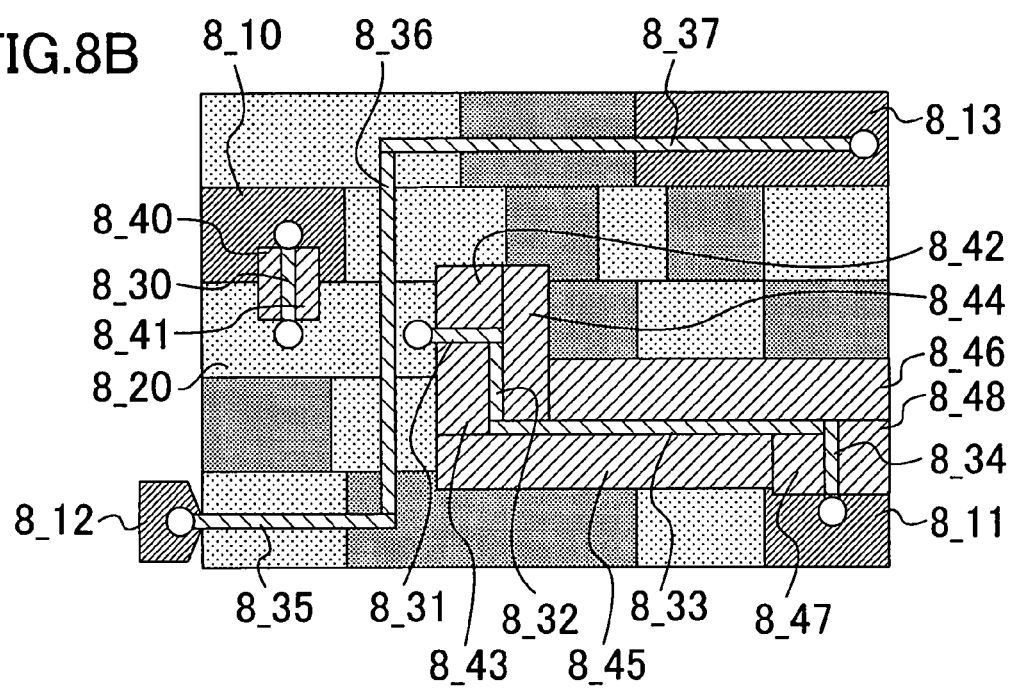

FIGS. 8A and 8B show an example of layout of a semiconductor integrated circuit for demonstrating a flow of processing in this embodiment. Referring to FIG. 8A, a flipflop 8_10 is connected with a combination element 8_20 via an interconnect 8_30. The combination element 8_20 is connected with a flipflop 8_11 via interconnects 8_31, 8_32, 8_33 and 8_34. An input port 8_12 is connected with a flipflop 8_13 via interconnects 8_35, 8_36 and 8_37. The white circles (○) in FIGS. 8A and 8B indicate connections between the interconnects and the flipflop/combination element/port.

Hereinafter, the flow of processing shown in FIG. 7 will be described with reference to FIGS. 8A and 8B.

In step 7_10, the total interconnect length of a path is calculated. The "path" as used herein refers to a route from a flipflop or an input port to a flipflop or an output port. In FIG. 8A, the route from the flipflop 8_10 to the flipflop 8_11 and the route from the input port 8_12 to the flipflop 8_13 are respectively paths.

In step 7_11, whether or not the total interconnect length of a path is equal to or less than a threshold is determined. If it is equal to or less than the threshold, air gap exclusion areas are formed around the interconnects in step 7_12.

The processing from the step 7_10 through the step 7_12 is executed for all paths.

The threshold used in the step 7_11 can be set by various calculation methods. As an example, considered is a method of using, as the threshold, the minimum value of the interconnect length with which the hold timing value can be satisfied when interconnects are driven with a buffer having the minimum drive power.

FIG. 8B shows an example of layout obtained after formation of air gap exclusion areas for the layout of FIG. 8A. Assume herein that the threshold is 125 um. With the total length of the interconnects 8_30, 8_31, 8_32, 8_33 and 8_34 being 100 um, which is less than the threshold, air gap exclusion areas 8_40, 8_41, 8_42, 8_43, 8_44, 8_45, 8_46, 8_47 and 8_48 are formed around these interconnects. Contrarily, with the total length of the interconnects 8_35, 8_36 and 8_37 being 150 um, which is greater than the threshold, no air gap exclusion area is formed around these interconnects.

As described above, in this embodiment, with the step 7_11 of calculating the total interconnect length of a path and the step 7_12 of forming air gap exclusion areas for interconnects whose total length is equal to or less than a threshold, no complicate delay calculation is necessary, and thus the time required for formation of air gap exclusion areas can be widely reduced.

Embodiment 4

A design method for an interconnect structure in Embodiment 4 of the present invention will be described.

When a region around a via is designated as an air gap exclusion area, a very small air gap will be generated for an interconnect that is extremely short and has vias at both ends.

Figure 9:
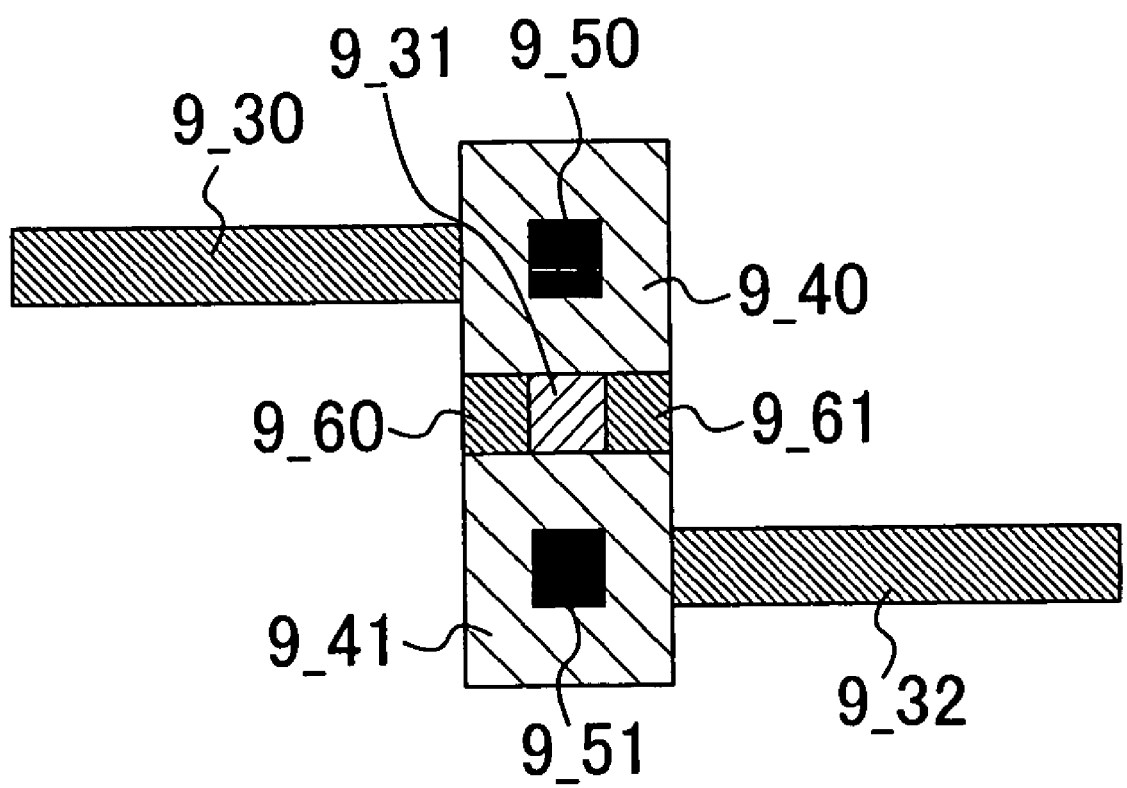
FIG. 9 is a view for demonstrating a design method for an interconnect structure in Embodiment 4.

FIG. 9 shows an example of layout of a semiconductor integrated circuit according to a conventional design method for an interconnect structure. A metal 3 layer interconnect 9_30 and a metal 4 layer interconnect 9_31 are connected with each other via a via 9_50, and the metal 4 layer interconnect 9_31 and a metal 3 layer interconnect 9_32 are connected with each other via a via 9_51. An air gap exclusion area 9_40 is formed around the via 9_50, and an air gap exclusion area 9_41 is formed around the via 9_51. Small spaces exist between the air gap exclusion areas 9_40 and 9_41, in which therefore very small air gaps 9_60 and 9_61 are generated. Such very small gaps hardly affect the timing.

This embodiment is characterized in forming an air gap exclusion area based on the interconnect length without causing a hold timing error.

Figure 10:
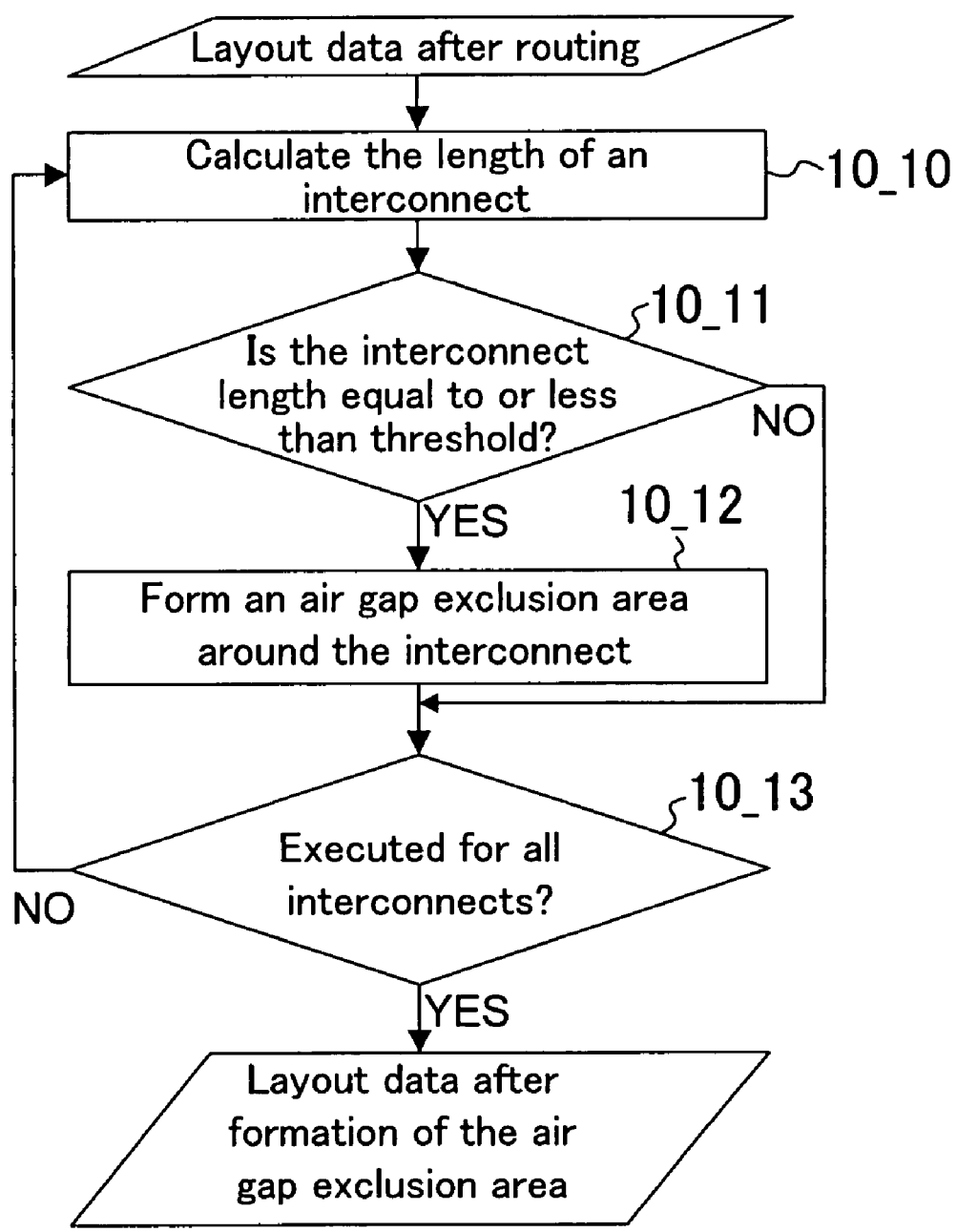
FIG. 10 is a flowchart of the design method for an interconnect structure in Embodiment 4.

FIG. 10 is a flowchart showing a design method for an interconnect structure in this embodiment related to the air gap exclusion area control step 2 in FIG. 1 described above.

Hereinafter, a flow of processing shown in FIG. 10 will be described.

In step 10_10, the length of an interconnect is calculated. Thereafter, in step 10_11, whether or not the length of the interconnect is equal to or less than a threshold is determined. If it is equal to or less than the threshold, an air gap exclusion area is formed around the interconnect in step 10_12. The processing from the step 10_10 through the step 10_12 is executed for all interconnects.

The threshold can be set by various calculation methods. As an example, considered is a method of using, as the threshold, the length ten times as large as the minimum via diameter.

Figure 11:
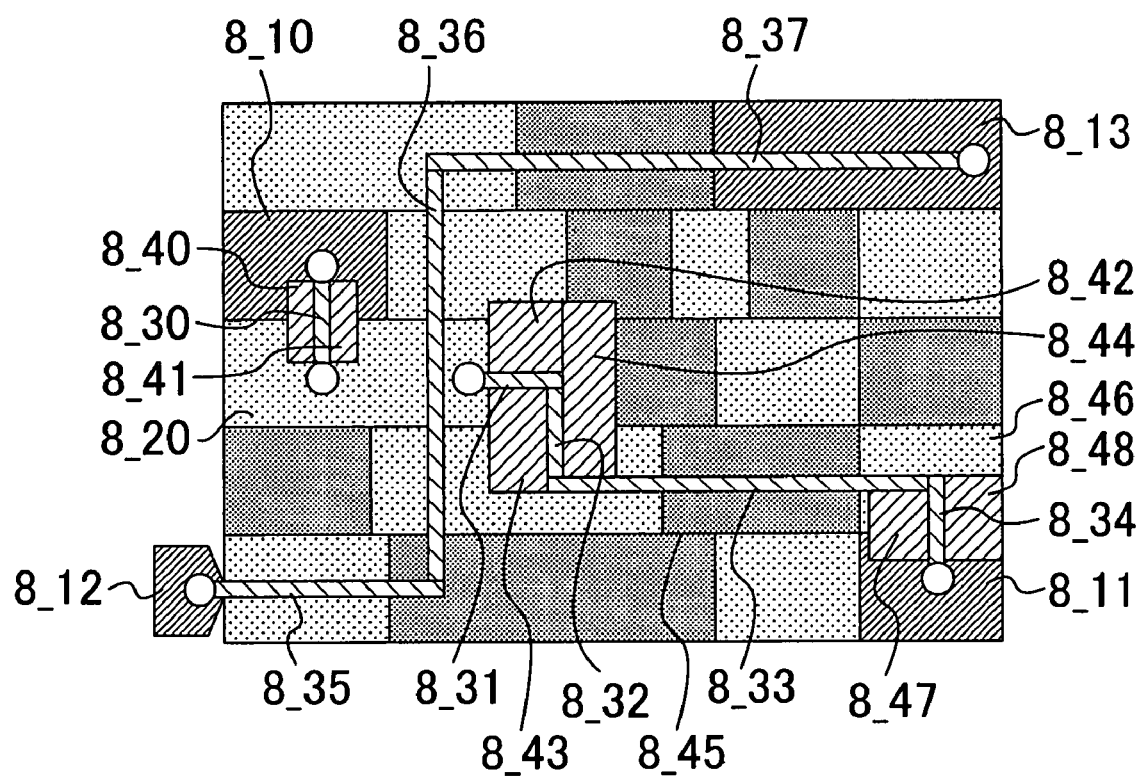
FIG. 11 is a view demonstrating the design method for an interconnect structure in Embodiment 4.

FIG. 11 shows an example of layout obtained after formation of air gap exclusion areas in this embodiment. The same reference numerals as those in FIG. 8B are used in FIG. 11. The length of the interconnect 8_33 is 40 um, which is greater than the threshold of 10 um. Therefore, the air gap exclusion areas 8_45 and 8_46 formed in Embodiment 3 are not formed in this embodiment.

The interconnect structure designed in this embodiment is characterized in that no air gap is formed around an interconnect having a length equal to or less than a given length.

As described above, in this embodiment, with the step 10_10 of calculating the length of an interconnect and the step of 10_12 of forming an air gap exclusion area for an interconnect whose length is equal to or less than a threshold, generation of an air gap whose influence on timing is minor is prohibited. This can prevent increase of the OPC processing time related to formation of air gaps without causing a hold timing error.

Embodiment 5

A design method for an interconnect structure in Embodiment 5 of the present invention will be described.

As for regions between dummy pattern traces, air gaps may or may not be generated therebetween from the standpoint of a timing error because a dummy pattern itself is not an object for timing calculation.

This embodiment is characterized in that air gap exclusion areas are formed in regions between dummy traces.

Figure 12:
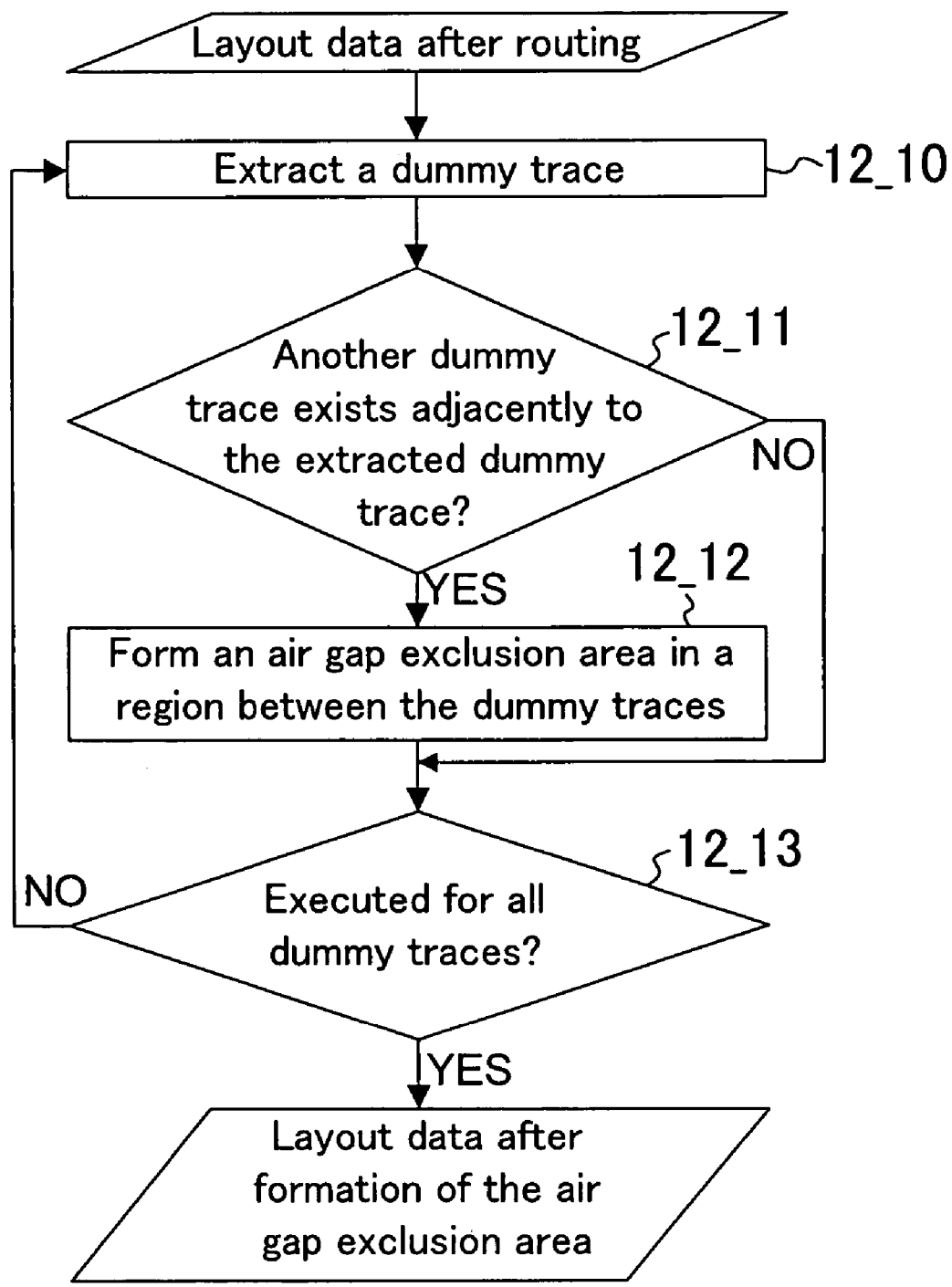
FIG. 12 is a flowchart of a design method for an interconnect structure in Embodiment 5.

FIG. 12 is a flowchart showing a design method for an interconnect structure in this embodiment related to the air gap exclusion area control step 2 in FIG. 1 described above.

Hereinafter, a flow of processing shown in FIG. 12 will be described.

In step 12_10, a dummy trace is extracted. Thereafter, in step 12_11, whether or not another dummy trace exists adjacently to the extracted dummy trace is determined.

If another dummy trace exists, an air gap exclusion area is formed in the region interposed between the two dummy traces in step 12_12.

The processing of the step 12_10 through the step 12_12 is executed for all dummy traces.

Figure 13:
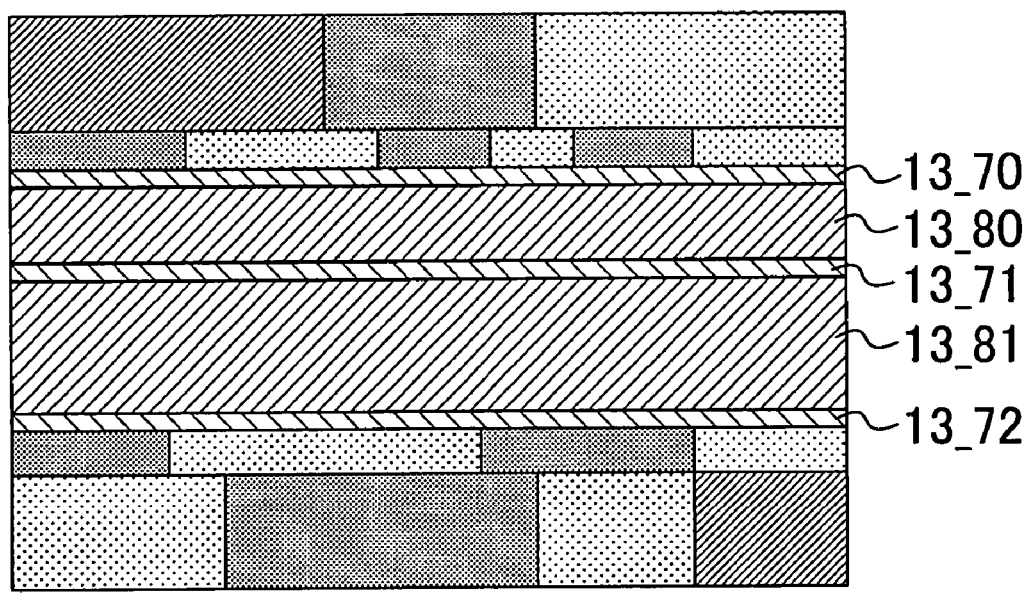
FIG. 13 is a view demonstrating the design method for an interconnect structure in Embodiment 5.

FIG. 13 shows an example of layout obtained after formation of air gap exclusion areas in this embodiment. Referring to FIG. 13, a region 13_80 exists between a dummy trace 13_70 and a dummy trace 13_71, and a region 13_81 exists between the dummy trace 13_71 and a dummy trace 13_72. In this embodiment, air gap exclusion areas are formed in the regions 13_80 and 13_81 irrespective of the width of the regions.

The interconnect structure designed according to this embodiment has a feature of having no air gaps in regions interposed between dummy traces.

As described above, with the step 12_12 of forming an air gap exclusion area in a region interposed between dummy traces, no small air gaps are formed between dummy traces, and this can prevent increase of the OPC processing time related to formation of air gaps.

Embodiment 6

A design method for an interconnect structure in Embodiment 6 of the present invention will be described.

As for regions between power supply pattern traces, air gaps may or may not be generated therebetween from the standpoint of a timing error because a power supply pattern itself is not an object for timing calculation. However, from the standpoint of power supply noise, formation of air gaps in the region between power supply traces will disadvantageously lowers the capacitance extrinsic to the power supply traces.

This embodiment is characterized in that air gap exclusion areas are formed in regions between power supply traces.

Figure 14:
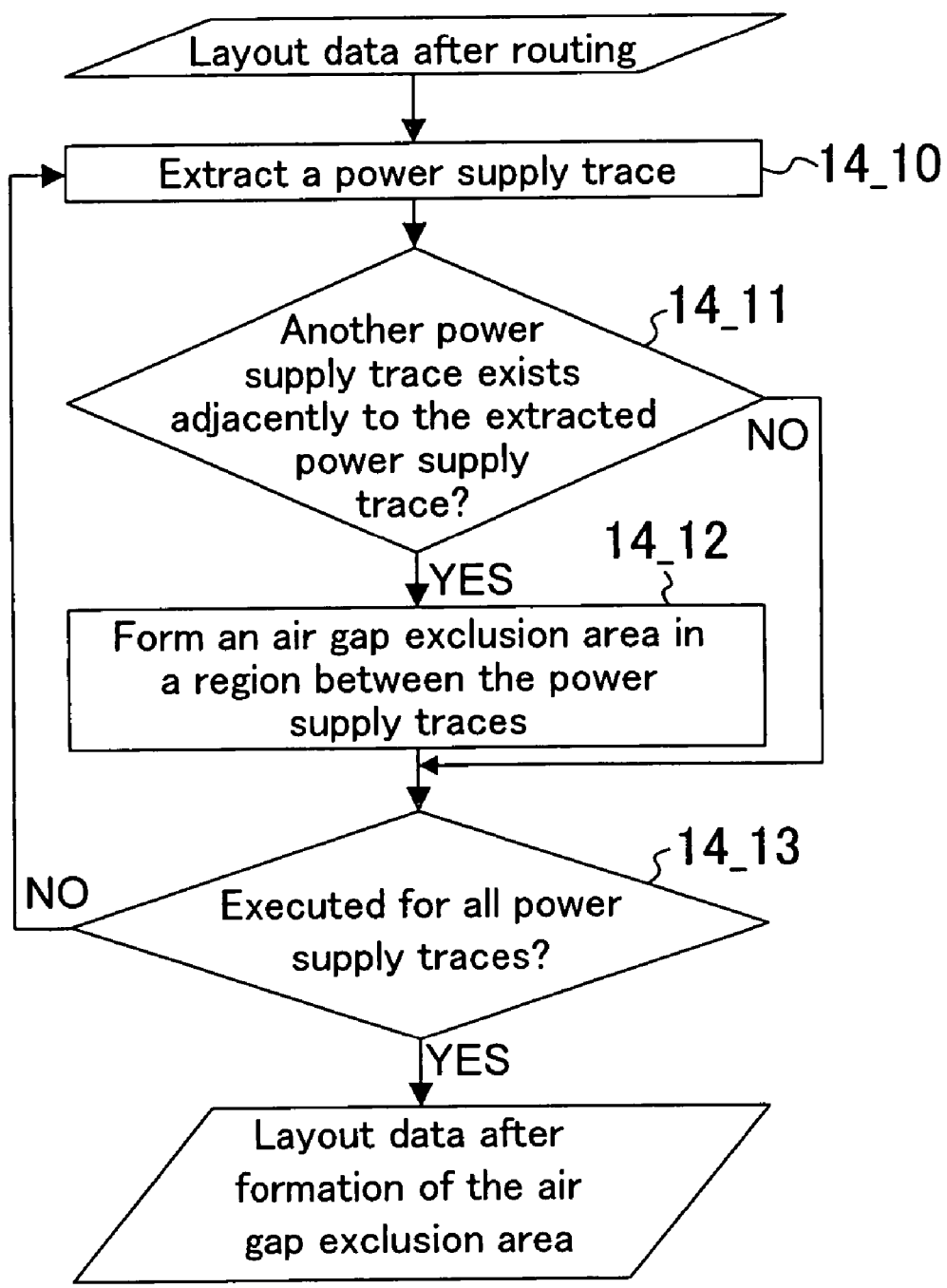
FIG. 14 is a flowchart of a design method for an interconnect structure in Embodiment 6.

FIG. 14 is a flowchart showing a design method for an interconnect structure in this embodiment related to the air gap exclusion area control step 2 in FIG. 1 described above.

Hereinafter, a flow of processing shown in FIG. 14 will be described.

In step 14_10, a power supply trace is extracted. Thereafter, in step 14_11, whether or not another power supply trace exists adjacently to the extracted power supply trace is determined. If another power supply trace exists, an air gap exclusion area is formed in the region interposed between the two power supply traces in step 14_12. The processing of the step 14_10 through the step 14_12 is executed for all power supply traces.

Figure 15:
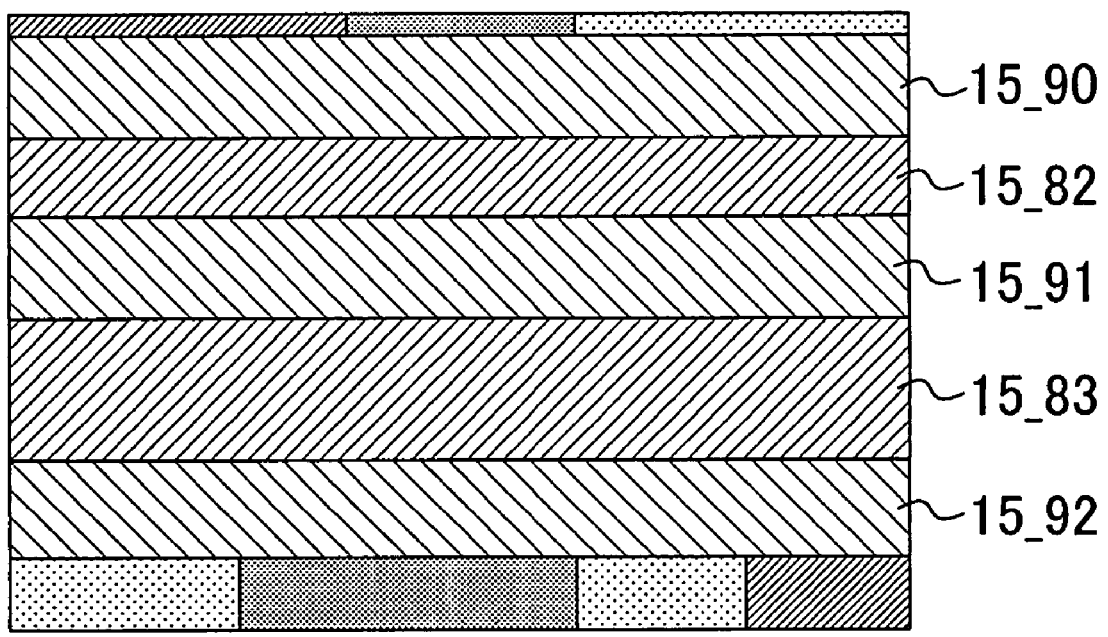
FIG. 15 is a view demonstrating the design method for an interconnect structure in Embodiment 6.

FIG. 15 shows an example of layout obtained after formation of air gap exclusion areas in this embodiment. Referring to FIG. 15, a region 15_82 exists between a power supply trace 15_90 and a power supply trace 15_91, and a region 15_83 exists between the power supply trace 15_91 and a power supply trace 15_92. In this embodiment, air gap exclusion areas are formed in the regions 15_82 and 15_83 irrespective of the width of the regions.

The interconnect structure designed according to this embodiment has a feature of having no air gaps in regions interposed between power supply traces.

As described above, with the step 14_12 of forming an air gap exclusion area in a region interposed between power supply traces, it is possible to prevent decrease in the load capacitance of the power supply traces and thus design an interconnect structure highly resistant to power supply noise.

Embodiment 7

A design method for an interconnect structure in Embodiment 7 of the present invention will be described.

This embodiment is characterized in that an air gap exclusion area is formed in advance over the entire chip and a portion of the air gap exclusion area at a setup timing error position is deleted.

Figure 16:
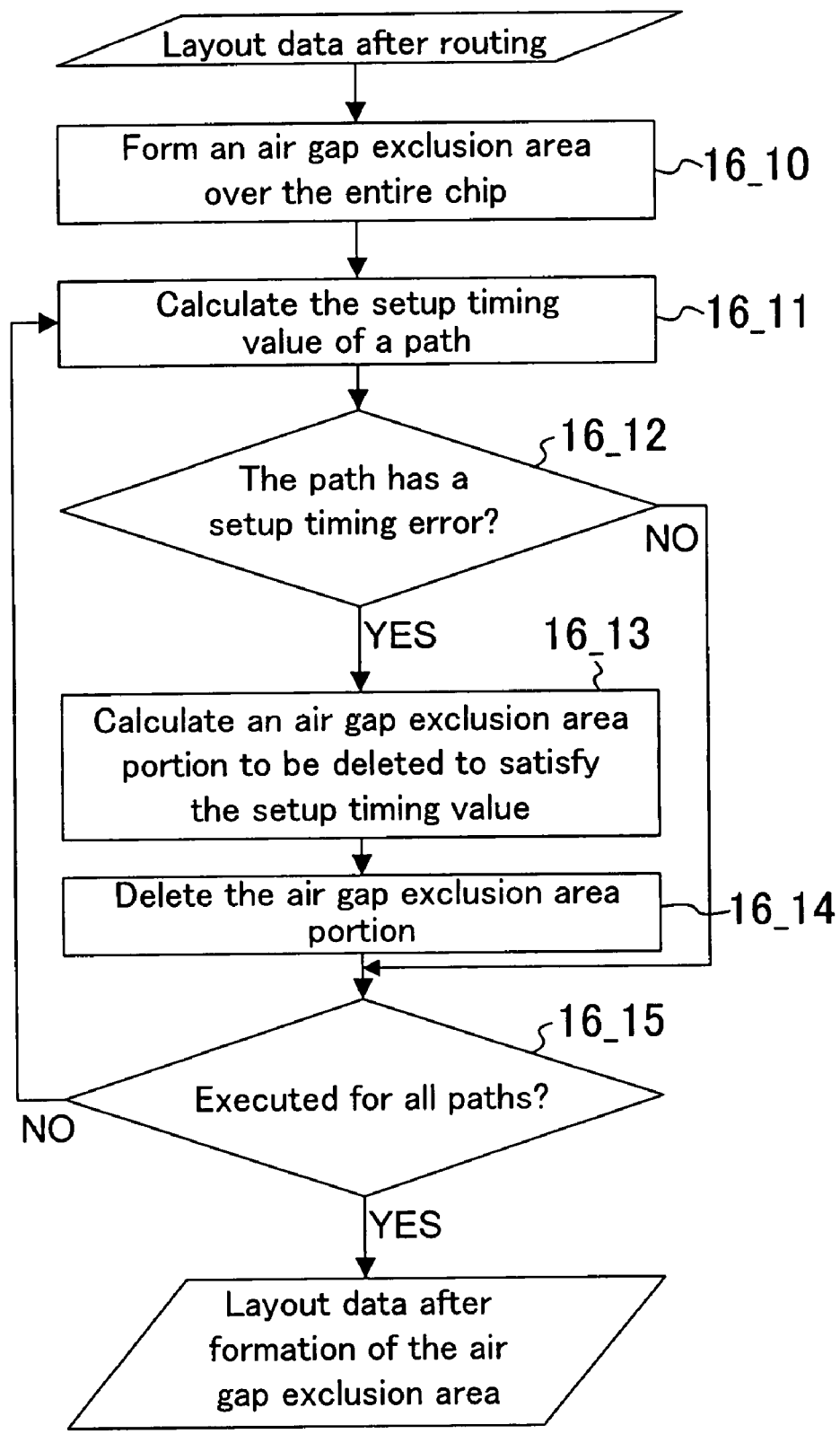
FIG. 16 is a flowchart of a design method for an interconnect structure in Embodiment 7.

FIG. 16 is a flowchart showing a design method for an interconnect structure in this embodiment related to the air gap exclusion area control step 2 in FIG. 1 described above.

Hereinafter, a flow of processing shown in FIG. 16 will be described.

In step 16_10, an air gap exclusion area is formed over the entire chip.

In step 16_11, the setup timing value of a path is calculated, and in step 16_12, whether or not a setup timing error has occurred is determined.

If a setup timing error has occurred, a portion of the air gap exclusion area that should be deleted to satisfy the setup timing value is calculated in step 16_13, and the portion of the air gap exclusion area is deleted in step 16_14.

The processing of the step 16_11 through the step 16_14 is executed for all paths.

Figure 17A:
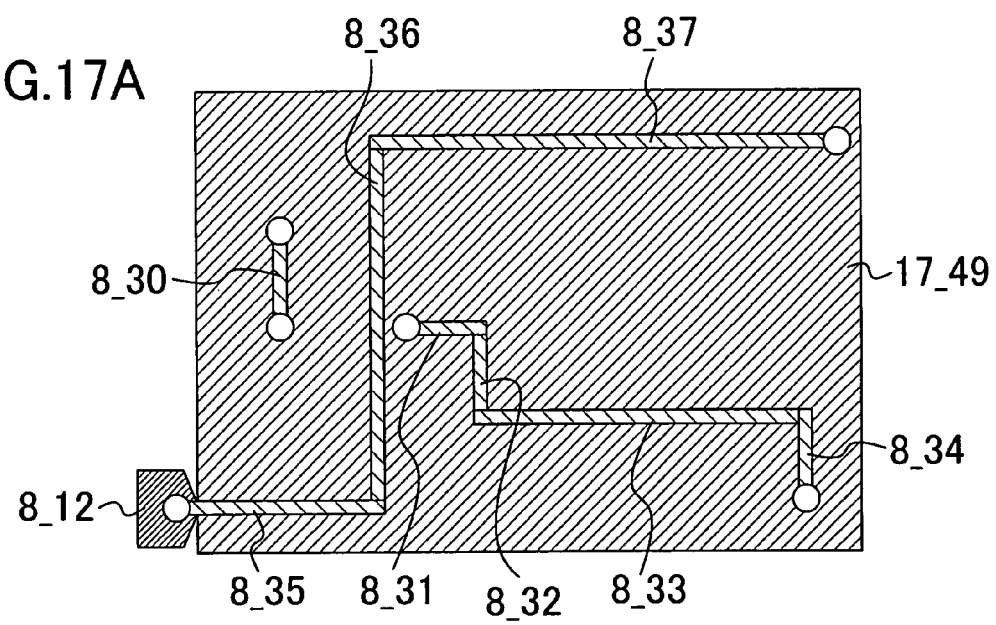
FIGS. 17A and 17B are views demonstrating the design method for an interconnect structure in Embodiment 7.
Figure 17B:
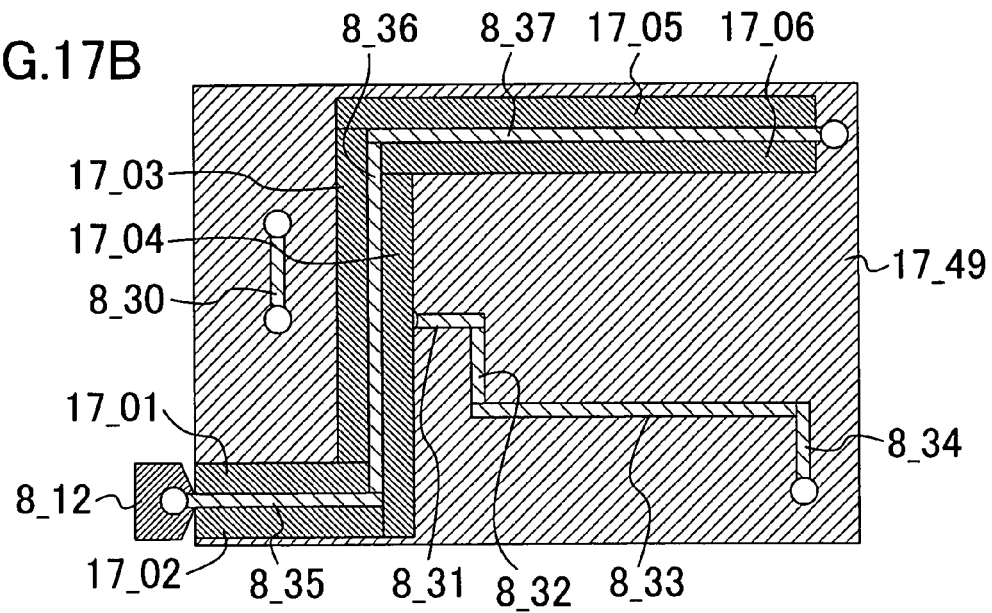

FIGS. 17A and 17B show an example of deletion of an air gap exclusion area in this embodiment.

FIG. 17A shows a layout obtained after execution of the step 16_10 for the layout of FIG. 8A. An air gap exclusion area 17_49 covers the entire chip.

FIG. 17B shows a layout obtained after execution of the step 16_11 through the step 16_15 for the layout of FIG. 17A, in which the air gap exclusion area has been deleted in portions 17_01, 17_02, 17_03, 17_04, 17_05 and 17_06.

As described above, with the step 16_10 of forming an air gap exclusion area over the entire chip and the step 16_13 of calculating a portion of the air gap exclusion area that should be deleted to satisfy the setup timing value, air gaps can be formed only at a setup timing error position. This can prevent increase of the air gap-related OPC processing time.

Embodiment 8

A design method for an interconnect structure in Embodiment 8 of the present invention will be described.

This embodiment is characterized in that a dummy trace is formed to run alongside a specific interconnect and the amount of an air gap exclusion area formed thereon is increased/decreased to enable delay adjustment.

Figure 18A:
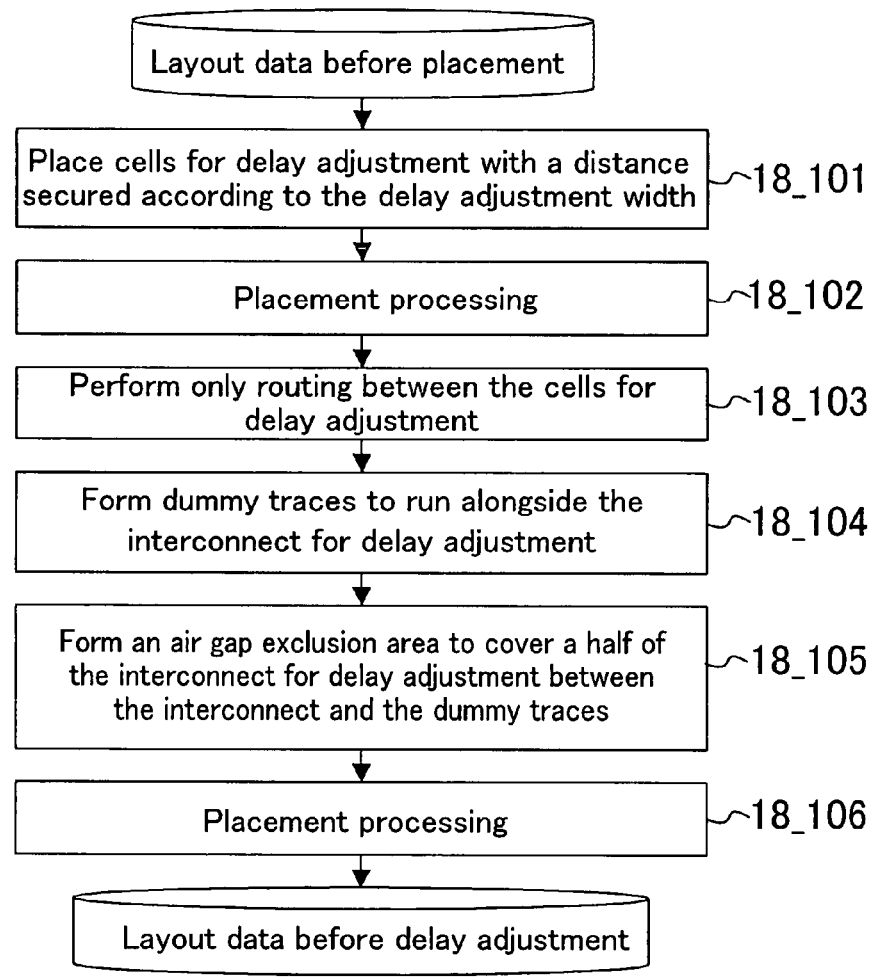
FIGS. 18A and 18B are flowcharts of a design method for an interconnect structure in Embodiment 8.
Figure 18B:
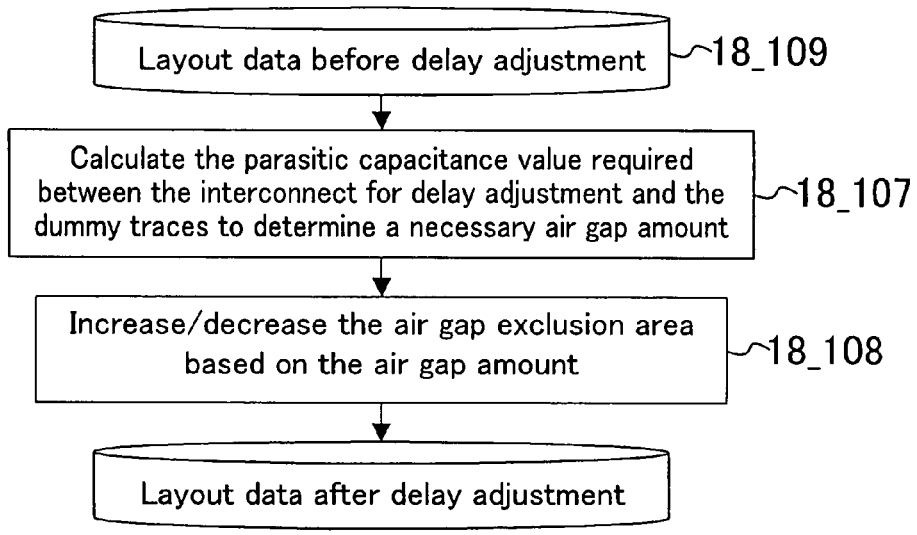

FIGS. 18A and 18B are flowcharts showing a design method for an interconnect structure in this embodiment, in which FIG. 18A shows a flow of placement/routing and FIG. 18B shows a flow of control of an air gap exclusion area after mask formation. Hereinafter, the flows of processing shown in FIGS. 18A and 18B will be described.

In step 18_101, cells for delay adjustment are placed in advance with a distance therebetween secured according to the delay adjustment width.

In step 18_102, general placement processing is performed for remaining cells.

In step 18_103, only routing between the cells for delay adjustment placed in the step 18_101 is performed.

In step 18_104, dummy traces are routed to run alongside the interconnect routed in the step 18_103 on both sides of the interconnect with a minimum interconnect spacing.

In step 18_105, an air gap exclusion area is formed so as to cover a half of the length of the interconnect including the dummy traces routed in the step 18_104.

In step 18_106, general routing processing is performed for remaining interconnects to complete layout design and output layout data.

The processing of FIG. 18B is started after mask formation.

In step 18_107, the delay adjustment amount of the cells for delay adjustment is calculated, and the parasitic capacitance value required between the interconnect and the dummy traces running alongside is obtained, to determine a necessary air gap amount.

In step 18_108, the air gap exclusion area is increased/decreased based on the air gap amount determined in the step 18_107.

Figure 19A:
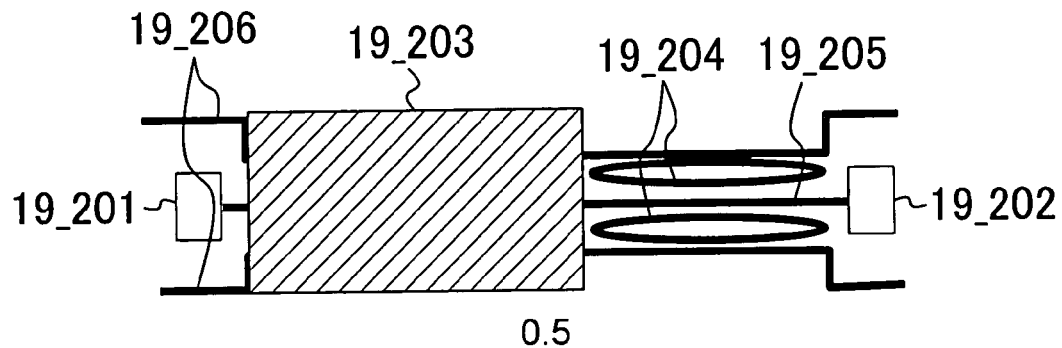
FIGS. 19A to 19C are views demonstrating the design method for an interconnect structure in Embodiment 8.
Figure 19B:
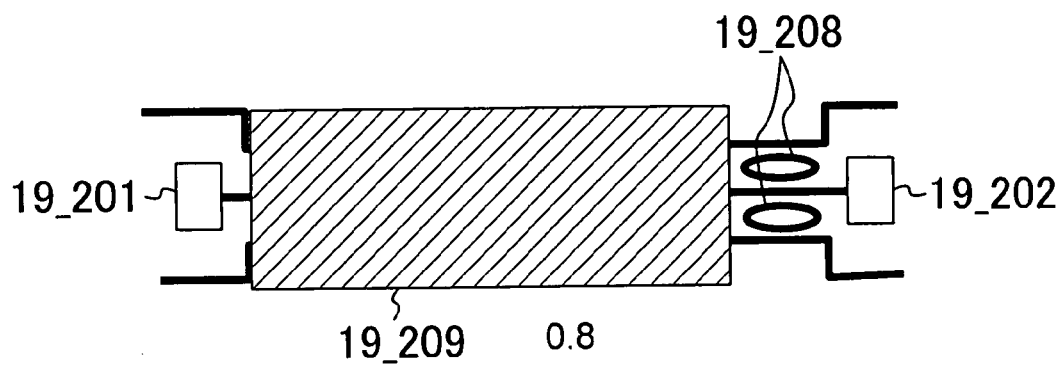
Figure 19C:
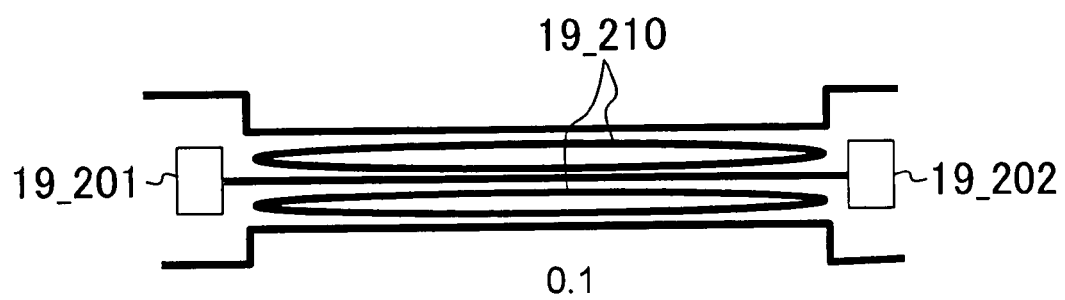

FIGS. 19A to 19C show an example of increase/decrease of an air gap exclusion area in this embodiment, in which FIG. 19A shows layout data 18_109, FIG. 19B shows an interconnect structure obtained when the air gap exclusion area is increased in the step 18_108, and FIG. 19C shows an interconnect structure obtained when the air gap exclusion area is decreased in the step 18_108.

The processing of the steps 18_104 and 18_105 will be described with reference to FIG. 19A.

In the step 18_104, dummy traces 19_206 are formed to run alongside an interconnect 19_205 connecting a cell 19_201 for delay adjustment with a cell 19_202 as output destination.

In the step 18_105, an air gap exclusion area 19_203 is formed so that a half of air gaps that will otherwise be generated between the interconnect 19_205 and the dummy traces 19_206 are buried.

The air gap exclusion area may be formed on the side closer to the cell 19_202, opposite to the side in FIG. 19A. Otherwise, air gaps and the air gap exclusion area may appear alternately between the cells.

Examples of increase/decrease of the air gap exclusion area in this embodiment will be described with reference to FIGS. 19B and 19C.

Assume, for example, that the load capacitance between the interconnect 19_205 and an adjacent trace in FIG. 19A is 0.5 pf and the delay value of the cell 19_201 is 2 ns.

In FIG. 19B, assume that a load capacitance between interconnects of 0.8 pf is necessary to adjust the delay value of the cell 19_201 to 3 ns. In this case, the amount of air gaps 19_208 that gives the load capacitance between interconnects of 0.8 pf is determined, and as a result, the air gap exclusion area 19_203 is increased to obtain an air gap exclusion area 19_209.

In FIG. 19C, assume that a load capacitance between interconnects of 0.1 pf is necessary to adjust the delay value of the cell 19_201 to 1 ns. In this case, the amount of air gaps 19_210 that gives the load capacitance between interconnects of 0.1 pf is determined, and as a result, the air gap exclusion area 19_203 is deleted.

The interconnect structure designed according this embodiment has a feature that interconnects running alongside with an equal spacing therebetween have both a portion including air gaps and a portion including no air gap.

As described above, with the step 18_105 of forming an air gap exclusion area in a region between an interconnect and a dummy trace running alongside, the step 18_107 of obtaining a required air gap amount and the step 18_108 of increasing/decreasing the air gap exclusion area, the delay value can be adjusted only by correcting the air gap exclusion layer without the necessity of correcting the metal layer and the via layer. Thus, the mask correction cost can be cut down.

Embodiment 9

A design method for an interconnect structure in Embodiment 9 of the present invention will be described.

This embodiment is characterized in prohibiting formation of interconnects having an interconnect spacing specified as a physical shape design constraint in the interconnect control step 4.

FIG. 20 shows an example of physical shape design constraint used in this embodiment.

Referring to FIG. 20, a physical shape design constraint X_AirGap_NoSpacing described in a physical shape design constraint file 20_001 prohibits formation of interconnects having an interconnect spacing falling within the range of minValue to maxValue inclusive in a metal layer X. The values of minValue and maxValue are determined depending on the semiconductor fabrication process.

For example, if

Metal1_AirGap_NoSpacing=0.4 um, 0.5 um    (Expression 1)

is described, a position in which interconnects are formed with an interconnect spacing falling within the range of 0.4 um to 0.5 um inclusive in a metal layer Metal1 will violate the physical shape design constraint.

Hereinafter, a flow of processing in this embodiment will be described.

Figure 21:
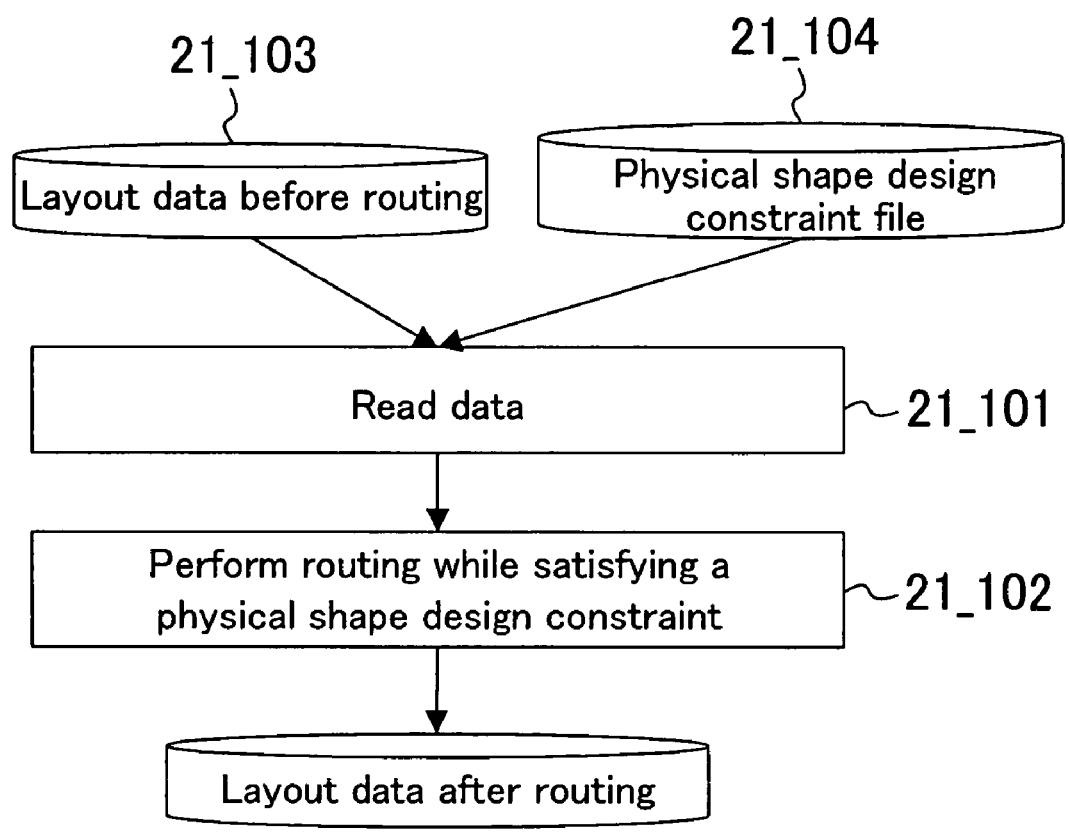
FIG. 21 is a flowchart of the design method for an interconnect structure in Embodiment 9.

FIG. 21 is a flowchart showing a flow of processing of a design method for an interconnect structure in this embodiment. Referring to FIG. 21, 21_104 denotes a physical shape design constraint file described in the format of FIG. 20.

In step 21_101, pre-routing layout data 21_103 and the physical shape design constraint file 21_104 are read.

In step 21_102, routing processing is performed based on a physical shape design constraint described in the physical shape design constraint file 21_104. At this time, if interconnects having an interconnect spacing falling within the range of minValue to maxValue inclusive defined for a relevant metal layer are formed, such interconnects are corrected to have a spacing outside the range of minValue to maxValue.

For example, one interconnect is made closer to an adjacent interconnect so that the spacing therebetween is less than minValue, or made farther from the adjacent interconnect so that the spacing therebetween is more than maxValue. Otherwise, this constraint may be cleared by changing the metal layer. In the case that one interconnect is made closer to an adjacent interconnect, the minimum interconnect spacing generally used as a physical shape design constraint should be satisfied.

Figure 22A:
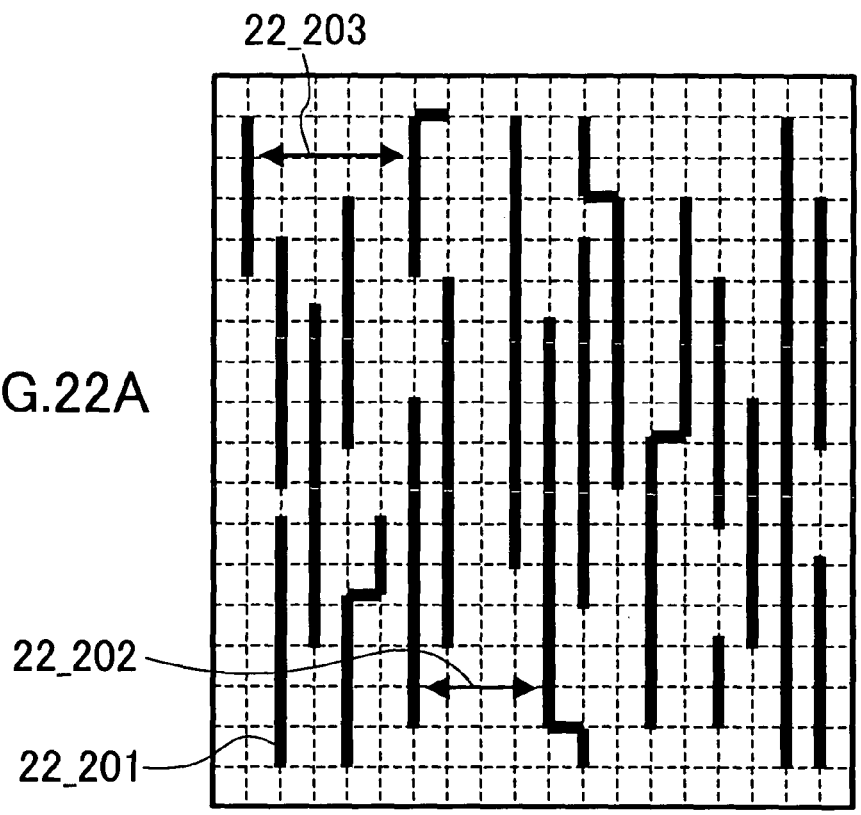
FIGS. 22A and 22B are views demonstrating the design method for an interconnect structure in Embodiment 9.
Figure 22B:
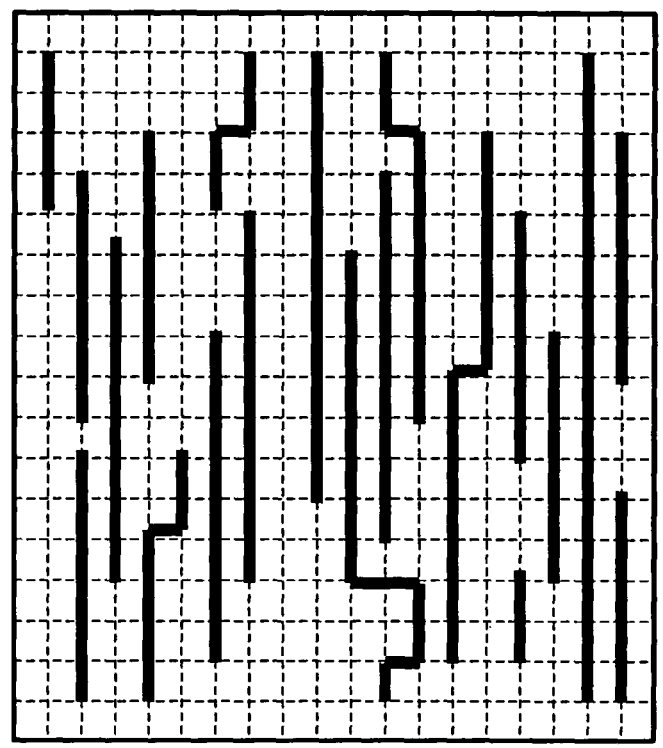

FIGS. 22A and 22B show an example of interconnect pattern produced in this embodiment, in which FIG. 22A shows a view of routing made without use of the physical shape design constraint of Expression 1 above, and FIG. 22B shows a view of routing made using this constraint.

If routing is made without use of the physical shape design constraint of Expression 1, the resultant pattern will have interconnect spacings 22_202 and 22_203 falling within the range of 0.4 um and 0.5 um inclusive as shown in FIG. 22A.

On the contrary, when using the physical shape design constraint of Expression 1, routing is made so as not to have an interconnect spacing falling within the range of 0.4 um and 0.5 um inclusive as shown in FIG. 22B.

The interconnect structure designed according to this embodiment has a feature that there are no interconnects having an interconnect spacing falling within a given range.

The physical shape design constraint may be presented by inputting a previously described physical shape design constraint file during a relevant design step for a semiconductor integrated circuit, or may be given as an instruction during a relevant design step.

As described above, with use of the physical shape design constraint prohibiting formation of interconnects having a specified interconnect spacing, generation of an air gap whose cone-shaped portion is high in level is avoided. This prevents formation of a hole during grinding, and thus improves the yield.

Embodiment 10

A design method for an interconnect structure in Embodiment 10 of the present invention will be described.

This embodiment is characterized in using a library having an air gap exclusion layer for definition of a via, in addition to a metal layer and a via layer, in the interconnect control step 4 in FIG. 2.

Figure 23A:
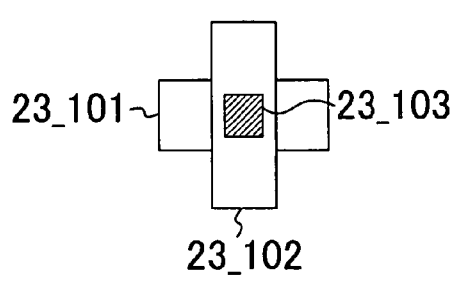
FIGS. 23A and 23B are views demonstrating a design method for an interconnect structure in Embodiment 10.

FIGS. 23A/B to 25A/B show via shapes in a library in this embodiment, in which 23_ to 25_101 and 23_ to 25_102 denote metal layers, 23_ to 25_103 denote via layers and 23_ to 25_104 denote air gap exclusion layers.

Figure 23B:
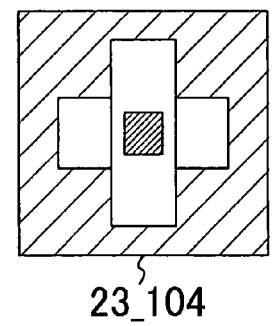
Figure 24A:
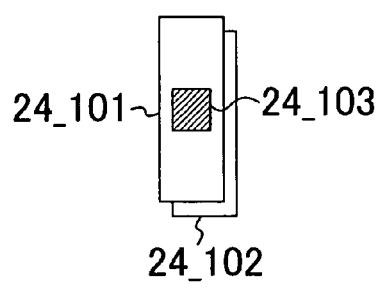
FIGS. 24A and 24B are views demonstrating the design method for an interconnect structure in Embodiment 10.
Figure 24B:
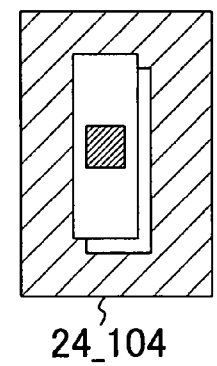
Figure 25A:
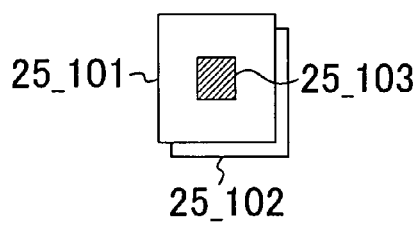
FIGS. 25A and 25B are views demonstrating the design method for an interconnect structure in Embodiment 10.
Figure 25B:
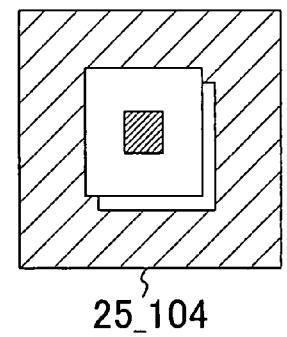

FIGS. 23A, 24A and 25A show via shapes each defined by the metal layers and the via layer, and FIGS. 23B, 24B and 25B show via shapes each defined further by the air gap exclusion layer in addition to the above layers.

Via shapes in conventional libraries correspond to those in FIGS. 23A, 24A and 25A.

Note that the size of the air gap exclusion layer for via definition should be the minimum value of the air gap exclusion area capable of preventing an air gap from communicating with a via due to an alignment deviation that may occur during semiconductor fabrication, which is determined depending on the semiconductor fabrication process.

As described above, with use of a library having an air gap exclusion layer for via definition, search for a via is no more necessary in formation of an air gap exclusion area, and thus the processing time can be reduced.

Embodiment 11

A design method for an interconnect structure in Embodiment 11 of the present invention will be described.

Before starting description of this embodiment, wording definition will be made. An "interconnect segment" as used herein refers to an interconnect continuous in a same metal layer, and a "max air gap generation spacing" refers to the maximum interconnect spacing allowing generation of an air gap.

This embodiment is characterized in that to reduce occurrence of a timing error, an interconnect segment allowing generation of an air gap is formed in the vicinity of an interconnect segment constituting a path that causes a setup timing error, and an interconnect segment not allowing generation of an air gap is formed in the vicinity of an interconnect segment constituting a path that causes a hold timing error.

Figure 26:
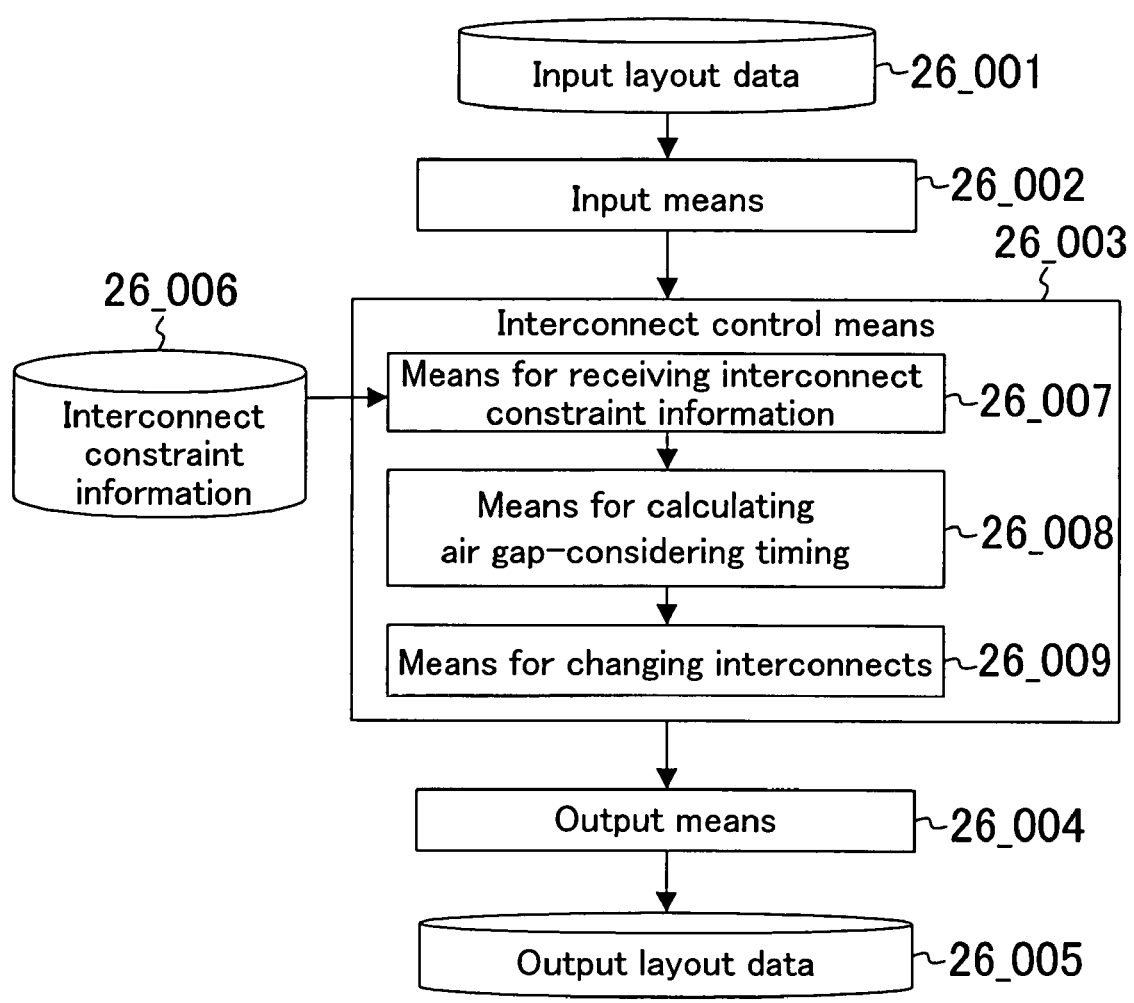
FIG. 26 is a block diagram of a design device for an interconnect structure in Embodiment 11.

FIG. 26 is a block diagram of a design device for an interconnect structure in this embodiment. Referring to FIG. 26, the design device includes: an input means 26_002 for receiving input layout data 26_001; an interconnect control means 26_003 for controlling interconnects to thereby control air gap generation positions for the input layout data; and an output means 26_004 for outputting output layout data 26_005. The interconnect control means 26_003 includes: a means 26_007 for receiving interconnect constraint information 26_006; a means 26_008 for calculating air gap-considering timing; and a means 26_009 for changing interconnects.

The interconnect control means 26_003 controls interconnects to thereby control air gap generation positions in the interconnect control step 4 in FIG. 2 described above.

Figure 27:
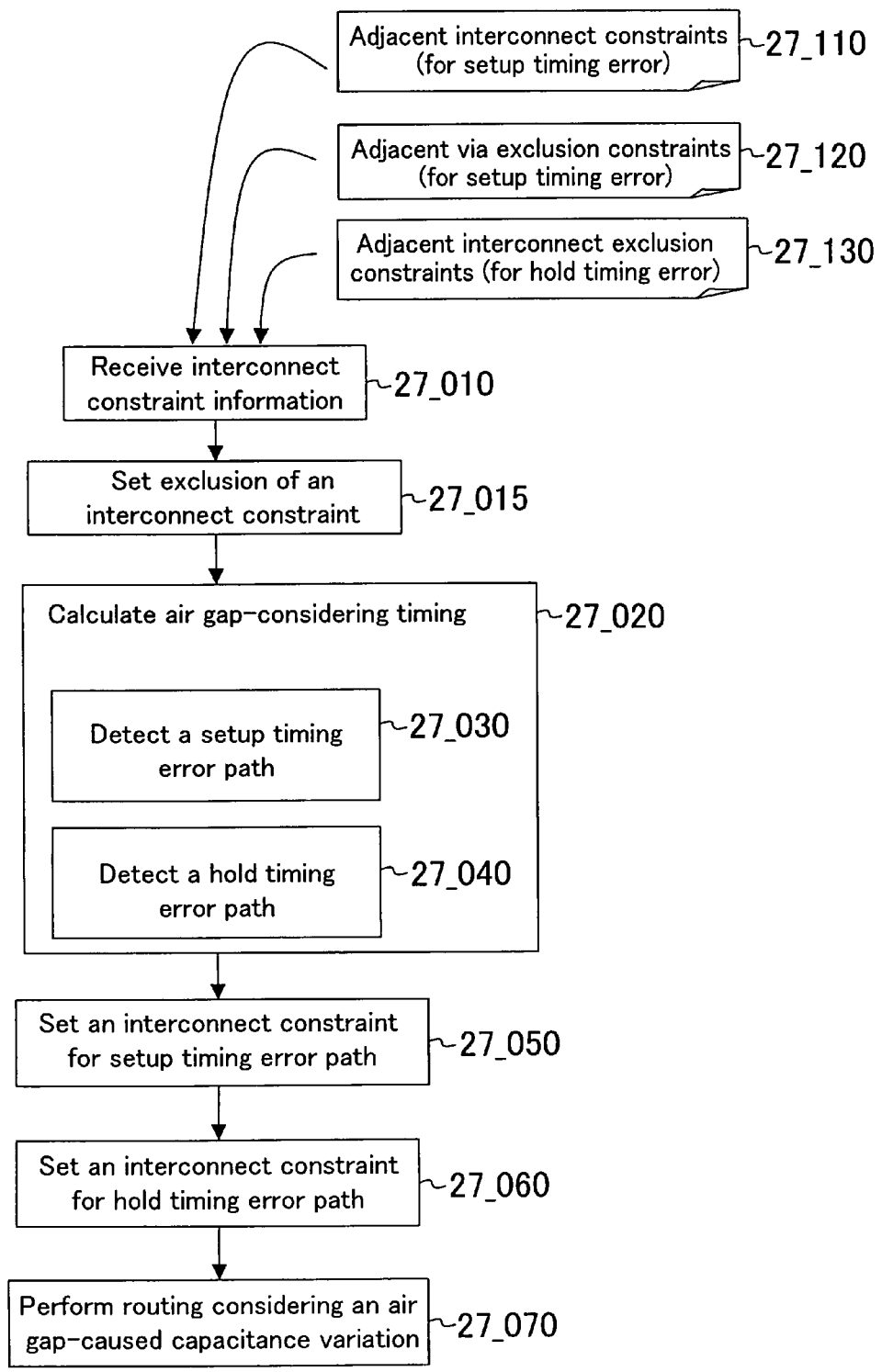
FIG. 27 is a flowchart of a design method for an interconnect structure in Embodiment 11.

FIG. 27 is a flowchart showing an operation of the interconnect control means 26_003 of the design device for an interconnect structure in this embodiment. The operation of the design device for an interconnect structure in this embodiment will be described with reference to FIG. 27.

Referring to FIG. 27, the operation includes a step 27_010 of receiving interconnect constraint information, a step 27_015 of setting exclusion of an interconnect constraint, a step 27_020 of calculating air gap-considering timing, in which a step 27_030 of detecting a setup timing error path and a step 27_040 of detecting a hold timing error path are included, a step 27_050 of setting an interconnect constraint for a setup timing error path, a step 27_060 of setting an interconnect constraint for a hold timing error path, and a step 27_070 of performing routing considering an air gap-caused capacitance variation. The steps 27_010 and 27_015 represent the operation of the means 26_007. The steps 27_020 through 27_060 represent the operation of the means 26_008, and the step 27_070 represents the operation of the means 26_009.

In the step 27_010 of receiving interconnect constraint information, the following interconnect constraints are inputted: adjacent interconnect constraints (for setup timing error) 27_110, adjacent via exclusion constraints (for setup timing error) 27_120 and adjacent interconnect exclusion constraints (for hold timing error) 27_130.

In the step 27_015 of setting exclusion of interconnect constraints, the shortest distance of each interconnect segment from its adjacent interconnect segment is calculated, and any interconnect having the shortest distance of a given value or more is set as being excluded from the target of the interconnect constraints received in the step 27_010.

Assume herein that the given value of the shortest distance is the maximum interconnect spacing that can give the effect of air gap-caused reduction in parasitic capacitance between interconnects. For example, if the interconnect spacing is very large, the parasitic capacitance between interconnects will be smaller than that obtained by having nearby air gaps. Therefore, setting is made to exclude, from the target of the interconnect constraints, any interconnect segment that is so large in the spacing from its adjacent interconnect segment that the parasitic capacitance between interconnects is smaller than that obtained by having nearby air gaps.

The shortest distance of each interconnect from its adjacent interconnect can be calculated from the actual interconnect spacing if routing has already been made, or by roughly estimating the interconnect route if routing has not yet been made.

Hereinafter, the interconnect constraints 27_110, 27_120 and 27_130 will be described.

The adjacent interconnect constraints (for setup timing error) 27_110 are constraints of allowing an interconnect segment in a net other than a specified net to be generated preferentially at a position apart from the specified net by the max air gap generation spacing. The effect of setting of such constraints will be described with reference to FIGS. 28A and 28B, in which 28_000 to 28_005 denote standard cells, 28_010, 28_020 and 28_030 denote nets, 28_011 denotes an interconnect segment for connecting the net 28_010, 28_021 denotes an interconnect segment for connecting the net 28_020, 28_031 denotes an interconnect segment for connecting the net 28_030, and 28_040 denotes the max air gap generation spacing.

Figure 28A:
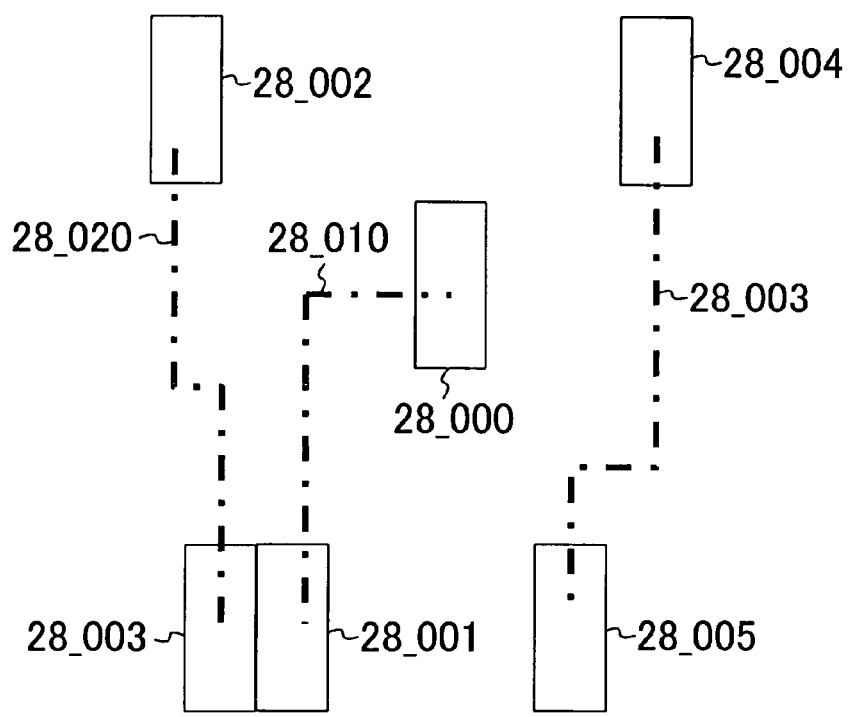
FIGS. 28A and 28B are views demonstrating the design method for an interconnect structure in Embodiment 11.
Figure 28B:
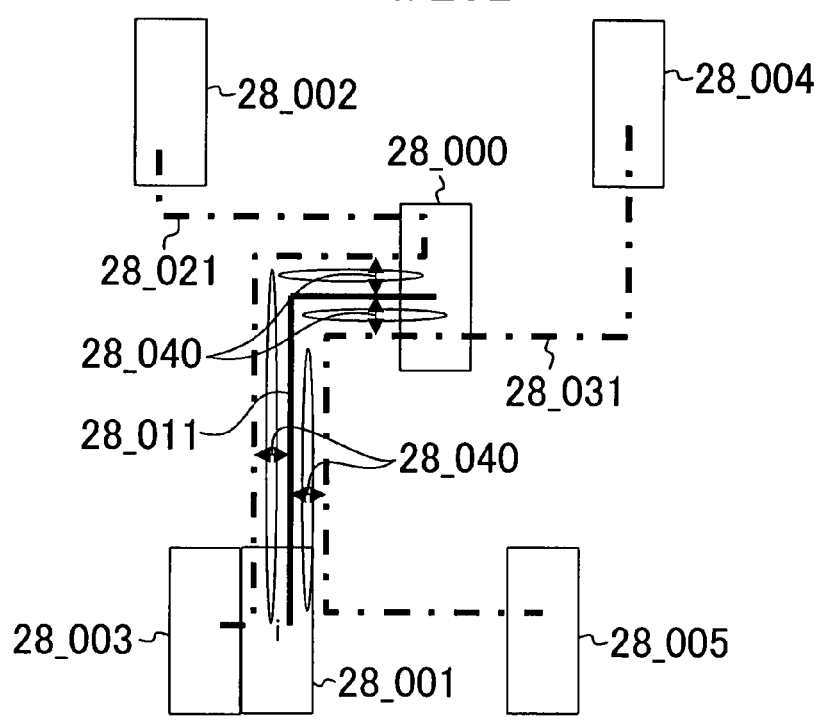

FIG. 28A shows the connection relationship among the standard cells 28_000 to 28_005. FIG. 28B shows an example of routing results obtained when the adjacent interconnect constraint (for setup timing error) is set for the net 28_010.

In general, an interconnect segment is formed so that a net is routed at the shortest distance. If an adjacent interconnect constraint (for setup timing error) is set, however, the interconnect segments 28_021 and 28_031 for other nets are formed at positions apart from the interconnect segment 28_011 for the specified net by the max air gap generation spacing 28_040. As a result, air gaps are generated adjacently to the interconnect segment 28_011 for the specified net.

The interconnect segments in only one layer were shown in FIGS. 28A and 28B for simplification of description. If a plurality of metal layers are involved, similar processing will be executed for each of such metal layers.

Figure 29:
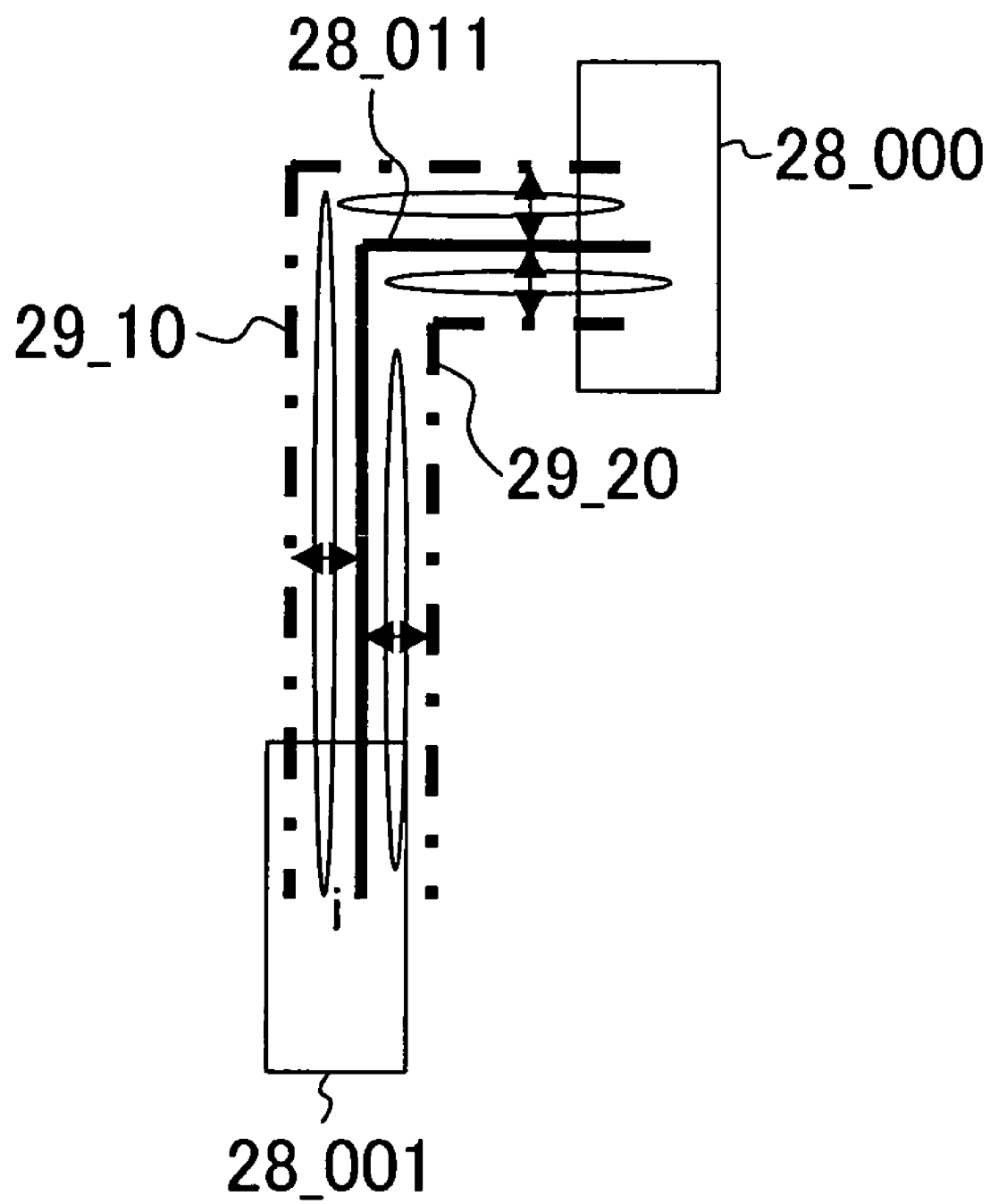
FIG. 29 is a view demonstrating the design method for an interconnect structure in Embodiment 11.

In FIG. 29, interconnect segments changed in routes were formed. Alternatively, the width of the interconnect segments for other nets may be made large so that the spacing from the interconnect segment for the specified net becomes the max air gap generation spacing. Otherwise, dummy traces may be formed at the max air gap generation spacing, as shown in FIG. 29. In FIG. 29, 29_10 and 29_20 denote dummy traces.

The adjacent via exclusion constraints (for setup timing error) 27_120 are constraints of prohibiting formation of a via for a net other than a specified net (via communicating with an interconnect formed in the same layer as an interconnect segment for the specified net) within the max air gap generation spacing from the specified net. The effect of setting such constraints will be described with reference to FIGS. 30A to 30C, in which 30_010 and 30_020 denote nets, 30_011, 30_021, 30_012 and 30_022 denote interconnect segments in the same metal layer, and 30_030 (shaded region filled with dots) denotes a region within the max air gap generation spacing of the net 30_020. Two metal layers exist in which vertical interconnects and horizontal interconnects as viewed from the figures are formed in different metal layers and are connected using vias.

Figure 30A:
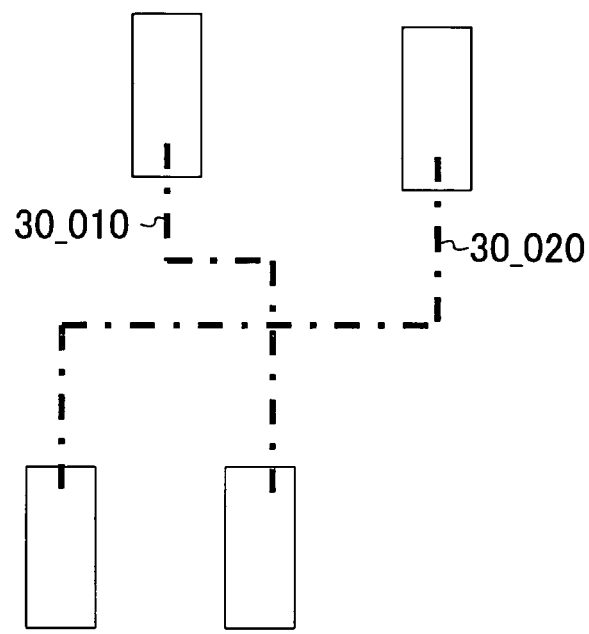
FIGS. 30A to 30C are views demonstrating the design method for an interconnect structure in Embodiment 11.
Figure 30B:
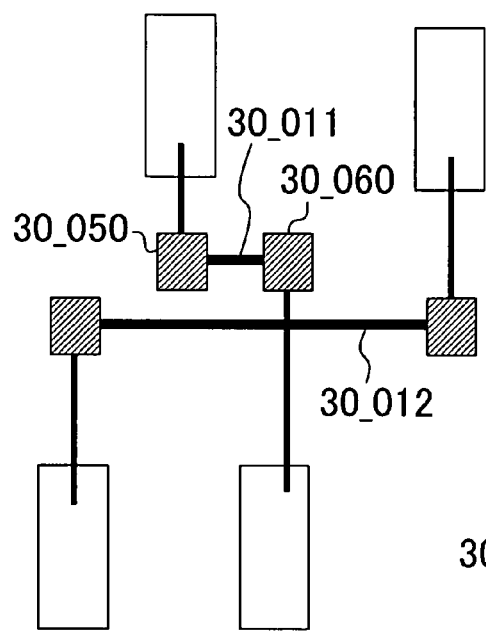
Figure 30C:
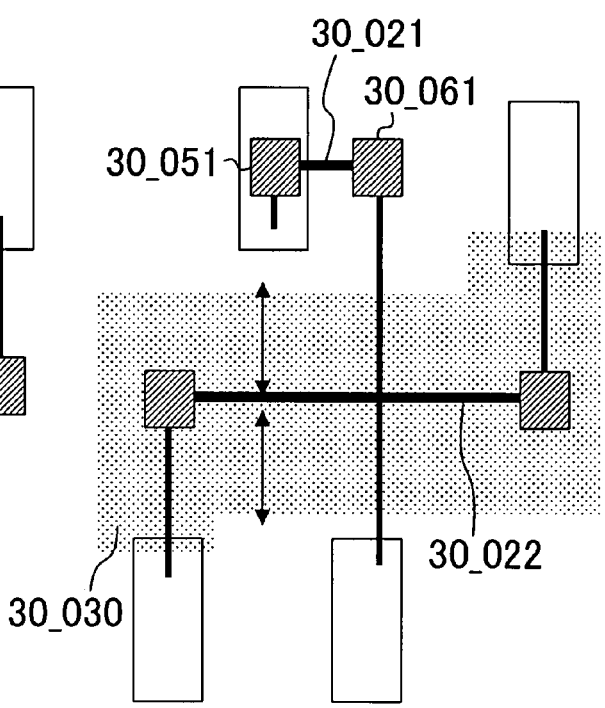

FIG. 30A shows the connection relationship among standard cells. FIG. 30C shows an example of routing results obtained when an adjacent via exclusion constraint (for setup timing error) is set for the net 30_020. FIG. 30B shows an example of routing results obtained when this constraint is not set. If this constraint is not set, vias 30_050 and 30_060 may possibly be formed as shown in FIG. 30B. By setting this constraint, vias 30_051 and 30_061 are formed outside the region 30_030 as shown in FIG. 30C.

If it is necessary to designate a region around a via as an air gap exclusion area and the via exists within the max air gap generation spacing, generation of air gaps is restricted even when an adjacent interconnect segment exists within the max air gap generation spacing. Therefore, to form as many air gaps as possible near an interconnect segment constituting a specified net, it is necessary to avoid formation of a via within the max air gap generation spacing from the interconnect segment constituting the specified net.

The adjacent interconnect exclusion constraints (for hold timing error) 27_130 are constraints of prohibiting formation of an interconnect segment for a net other than a specified net in the same metal layer as an interconnect segment for the specified net within the max air gap generation spacing.

As a result, no air gap will exist near the interconnect segment constituting the specified net. such constraints are set to increase the delay value of a path in which a hold timing error has occurred.

Now referring back to FIG. 27, in the step 27_020 of calculating air gap-considering timing, the step 27_030 of detecting a setup timing error path and the step 27_040 of detecting a hold timing error path are performed. If routing has been completed, air gap generation positions are calculated based on the actual interconnects, and timing calculation is executed based on a value of corresponding interconnect capacitance calculated. If routing has not yet been completed, air gap generation positions are predicted to execute similar timing calculation.

In the step 27_050 of setting an interconnect constraint for a setup timing error path, an interconnect constraint from the adjacent interconnect constraints (for setup timing error) 27_110 and the adjacent via exclusion constraints (for setup timing error) 27_120 is set for a net constituting a path detected in the step 27_030 of detecting a setup timing error path.

In the step 27_060 of setting an interconnect constraint for a hold timing error path, an interconnect constraint from the adjacent interconnect exclusion constraints (for hold timing error) 27_130 is set for a net constituting a path detected in the step 27_040 of detecting a hold timing error path.

In the step 27_070 of performing routing considering an air gap-caused capacitance variation, routing is made satisfying, or preferentially satisfying, any constraint set in the step 27_050 and the step 27_060.

If routing has been completed, all interconnects are pulled off and the above routing step 27_070 is executed.

As described above, with the adjacent interconnect constraints 27_110, the adjacent via exclusion constraints 27_120, the adjacent interconnect exclusion constraints 27_130, and the step 27_070 of performing routing considering an air gap-caused capacitance variation, air gaps are preferentially generated near an interconnect segment constituting a path having a setup timing error. This reduces the delay value of the path, and thus the setup timing error decreases. Also, no air gap is generated near a path having a hold timing error. This does not reduce the delay value of the path, and thus the hold timing error does not increase. In this way, the setup timing error can be reduced without increasing the hold timing error.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A method for designing an interconnect structure of an interconnect layer in a semiconductor integrated circuit device, the method comprising steps of:
   (a) inputting, from a storage device, layout data of the semiconductor integrated circuit device;
   (b) controlling an air gap exclusion area based on interconnects in the layout data; and
   (c) outputting, to a storage device, layout data including the air gap exclusion area determined in the step (b), wherein:
   the step (b) comprises steps of:
      (b1) performing timing calculation for the layout data;
      (b2) specifying a timing error position in the layout data based on results obtained in the step (b1);
      (b3) specifying an amount and a position of an air gap exclusion area to be inserted for the timing error position; and
      (b4) forming or deleting an air gap exclusion area for the timing error position, and
   the steps (a) through (c) are performed by a device for designing an interconnect structure.

2. The method of claim 1, wherein:
   in the step (b3), for a hold timing error position, the entire of the position is designated as an air gap exclusion area, and
   for a setup timing error position, the entire of the position is designated as an air gap generation area.

3. The method of claim 1, wherein in the step (b3), the amount of an air gap exclusion area required to correct a timing error is calculated from an amount of change in interconnect parasitic capacitance with existence/absence of an air gap.

4. A method for designing an interconnect structure of an interconnect layer in a semiconductor integrated circuit device, the method comprising steps of:
   (a) inputting, from a storage device, layout data of the semiconductor integrated circuit device;
   (b) controlling an air gap exclusion area based on interconnects in the layout data; and
   (c) outputting, to a storage device, layout data including the air gap exclusion area determined in the step (b), wherein:
   the step (b) comprises steps of:
      calculating a total interconnect length of each path in the layout data; and
      forming an air gap exclusion area for a path whose total interconnect length is equal to or less than a given threshold, and
   the steps (a) through (c) are performed by a device for designing an interconnect structure.

5. A method for designing an interconnect structure of an interconnect layer in a semiconductor integrated circuit device, the method comprising steps of:
   (a) inputting, from a storage device, layout data of the semiconductor integrated circuit device;
   (b) controlling an air gap exclusion area based on interconnects in the layout data; and
   (c) outputting, to a storage device, layout data including the air gap exclusion area determined in the step (b), wherein:
   the step (b) comprises steps of:
      calculating a length of each interconnect of each path in the layout data; and
      forming an air gap exclusion area for an interconnect whose length is equal to or less than a given threshold, and
   the steps (a) through (c) are performed by a device for designing an interconnect structure.

6. A method for designing an interconnect structure of an interconnect layer in a semiconductor integrated circuit device, the method comprising steps of:
   (a) inputting, from a storage device, layout data of the semiconductor integrated circuit device;
   (b) controlling an air gap exclusion area based on interconnects in the layout data; and
   (c) outputting, to a storage device, layout data including the air gap exclusion area determined in the step (b), wherein:
   the step (b) comprises steps of:
      detecting adjacent dummy patterns in the layout data; and
      forming an air gap exclusion area in a region interposed between the adjacent dummy patterns, and
   the steps (a) through (c) are performed by a device for designing an interconnect structure.

7. A method for designing an interconnect structure of an interconnect layer in a semiconductor integrated circuit device, the method comprising steps of:
   (a) inputting, from a storage device, layout data of the semiconductor integrated circuit device;
   (b) controlling an air gap exclusion area based on interconnects in the layout data; and
   (c) outputting, to a storage device, layout data including the air gap exclusion area determined in the step (b), wherein:
   the step (b) comprises steps of:

detecting adjacent power supply wirings in the layout data; and forming an air gap exclusion area in a region interposed between the adjacent power supply wirings, and the steps (a) through (c) are performed by a device for designing an interconnect structure.

8. A method for designing an interconnect structure of an interconnect layer in a semiconductor integrated circuit device, the method comprising steps of:

(a) inputting, from a storage device, layout data of the semiconductor integrated circuit device;

(b) controlling an air gap exclusion area based on interconnects in the layout data; and (c) outputting, to a storage device, layout data including the air gap exclusion area determined in the step (b), wherein:

the step (b) comprises steps of:

forming an air gap exclusion area over the entire chip in the layout data;

performing timing calculation for the layout data;

specifying a timing error position in the layout data based on results obtained in the step of performing timing calculation;

calculating a portion of the air gap exclusion area to be deleted for the timing error position; and deleting the calculated portion from the air gap exclusion area formed over the entire chip, and the steps (a) through (c) are performed by a device for designing an interconnect structure.

9. A method for designing an interconnect structure of an interconnect layer in a semiconductor integrated circuit device, the method comprising steps of:

(a) inputting, from a storage device, layout data of the semiconductor integrated circuit device;

(b) controlling an air gap exclusion area based on interconnects in the layout data; and (c) outputting, to a storage device, layout data including the air gap exclusion area determined in the step (b), wherein:

the step (b) comprises steps of:

forming a dummy pattern running alongside a specific interconnect in the layout data;

forming an air gap exclusion area between the specific interconnect and the alongside-running dummy pattern;

determining a required air gap amount from a parasitic capacitance value required between the specific interconnect and the alongside-running dummy pattern; and increasing/decreasing the air gap exclusion area based on the required air gap amount, and the steps (a) through (c) are performed by a device for designing an interconnect structure.

10. A device for designing an interconnect structure of an interconnect layer in a semiconductor integrated circuit device, the device comprising:

an input unit for inputting layout data for the semiconductor integrated circuit device;

a controlling unit for controlling an air gap exclusion area based on interconnects in the layout data; and an outputting unit for outputting layout data including the air gap exclusion area determined by the controlling unit, wherein the controlling unit comprises:

a timing calculation unit for performing timing calculation for the layout data;

a timing error position specifying unit for specifying a timing error position in the layout data based on results obtained by the timing calculation unit;

an air gap specifying unit for specifying an amount and a position of an air gap exclusion area to be inserted for the timing error position; and an air gap arranging unit for forming or deleting an air gap exclusion area for the timing error position.

11. A method for designing an interconnect structure of an interconnect layer in a semiconductor integrated circuit device, the method comprising steps of:

(a) inputting, from a storage device, layout data of the semiconductor integrated circuit device;

(b) controlling interconnects in the layout data for controlling an air gap generation position; and (c) outputting, to a storage device, layout data including the interconnects and the gap generation position determined in the step (b), wherein:

in the step (b), formation of interconnects having a spacing falling within a specified range is prohibited using a physical shape design constraint file, and the steps (a) through (c) are performed by a device for designing an interconnect structure.

12. The method of claim 11, wherein the physical shape design constraint file has a constraint value for prohibiting formation of interconnects having a spacing falling within a specified range.

13. A method for designing an interconnect structure of an interconnect layer in a semiconductor integrated circuit device, the method comprising steps of:

(a) inputting, from a storage device, layout data of the semiconductor integrated circuit device;

(b) controlling interconnects in the layout data for controlling an air gap generation position; and (c) outputting, to a storage device, layout data including the interconnects and the gap generation position determined in the step (b), wherein:

the step (b) comprises steps of:

(b1) inputting interconnect constraint information;

(b2) performing air gap-considering timing calculation for the layout data; and (b3) changing interconnects in the layout data considering an air gap-caused capacitance variation, and the steps (a) through (c) are performed by a device for designing an interconnect structure.

14. The method of claim 13, wherein in the step (b3), in the changing interconnects, an interconnect is made to run alongside an interconnect having a setup timing error.

15. The method of claim 13, wherein in the step (b3), in the changing interconnects, an interconnect is formed inside a specified interconnect spacing.

16. The method of claim 13, wherein in the step (b3), in the changing interconnects, no via is formed inside a specified interconnect spacing.

17. The method of claim 13, wherein in the step (b3), in the changing interconnects, an interconnect detouring is formed to ensure that no interconnect runs alongside an interconnect having a hold error with a spacing therebetween falling within a specified range.

18. A device for designing an interconnect structure of an interconnect layer in a semiconductor integrated circuit device, the device comprising:

an inputting unit for inputting layout data of the semiconductor integrated circuit device;

a controlling unit for controlling interconnects in the layout data for controlling an air gap formation position; and an outputting unit for outputting layout data including the interconnects and the air gap formation position determined by the controlling unit, wherein the controlling unit comprises:

an information inputting unit for inputting interconnect constraint information;

an timing calculating unit for performing air gap-considering timing calculation for the layout data; and a changing unit for changing interconnects in the layout data considering an air gap-caused capacitance variation.

19. An interconnect structure of an interconnect layer comprising:

at least one air gap in a semiconductor integrated circuit device, wherein:

no air gaps are provided between adjoining dummy patterns located in a portion of the semiconductor integrated circuit device, and said at least one air gap is provided between adjoining dummy patterns located outside the portion of the semiconductor integrated circuit device.

20. An interconnect structure of an interconnect layer comprising:

at least one air gap in a semiconductor integrated circuit device, wherein:

no air gaps are provided between adjoining power supply wirings located in a portion of the semiconductor integrated circuit device, and said at least one air gap is provided between adjoining power supply wirings located outside the portion of the semiconductor integrated circuit device.

* * * * *

UNITED STATES PATENT AND TRADEMARK OFFICE
CERTIFICATE OF CORRECTION

PATENT NO. : 7,913,221 B2
APPLICATION NO. : 11/907999
DATED : March 22, 2011
INVENTOR(S) : Hirofumi Miyashita et al.

It is certified that error appears in the above-identified patent and that said Letters Patent is hereby corrected as shown below:

Insert

--(56)   References Cited

FOREIGN PATENT DOCUMENTS        JP 3481222--

Signed and Sealed this
Twenty-fourth Day of May, 2011

David J. Kappos
*Director of the United States Patent and Trademark Office*